United States Patent
Li

(10) Patent No.: US 12,423,377 B2
(45) Date of Patent: Sep. 23, 2025

(54) COMPUTATION IN MEMORY ARCHITECTURE FOR PHASED DEPTH-WISE CONVOLUTIONAL

(71) Applicant: QUALCOMM Incorporated, San Diego, CA (US)

(72) Inventor: Ren Li, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 1030 days.

(21) Appl. No.: 17/361,807

(22) Filed: Jun. 29, 2021

(65) Prior Publication Data

US 2022/0414454 A1  Dec. 29, 2022

(51) Int. Cl.
*G06F 17/15* (2006.01)
*G06F 9/38* (2018.01)
*G06G 7/16* (2006.01)

(52) U.S. Cl.
CPC .......... *G06F 17/153* (2013.01); *G06F 9/3889* (2013.01); *G06G 7/16* (2013.01)

(58) Field of Classification Search
CPC ... G06F 7/15; G06F 7/153; G06F 7/16; G06F 7/5443; G06F 9/3889; G06G 7/16; G06N 3/063; G06N 3/065; G06N 3/0464; G11C 11/54
See application file for complete search history.

(56) References Cited

U.S. PATENT DOCUMENTS

2022/0129519 A1* 4/2022 Zheng .................... G06F 17/16

OTHER PUBLICATIONS

Q. Zheng et al., "MobiLattice: A Depth-wise DCNN Accelerator with Hybrid Digital/Analog Nonvolatile Processing-In-Memory Block," 2020 IEEE/ACM International Conference On Computer Aided Design (ICCAD), San Diego, CA, USA, 2020, pp. 1-9 (Year: 2020).*
S. Wen et al., "Memristor-Based Design of Sparse Compact Convolutional Neural Network," in IEEE Transactions on Network Science and Engineering, vol. 7, No. 3, pp. 1431-1440, Jul. 1-Sep. 2020, doi: 10.1109/TNSE.2019.2934357. (Year: 2019).*
Angizi S., et al., "CMP-PIM: An Energy-Efficient Comparator-based Processing-In-Memory Neural Network Accelerator," Jun. 24, 2018, DAC '18: Proceedings of the 55th Annual Design Automation Conference, Jun. 2018, Article No. 105, pp. 1-6, XP033405903, DOI: 10.1109/DAC.2018.8465860 [Retrieved on Sep. 13, 2018] Abstract Figures 1-2 Sections 2.2, 3 and 4, p. 2-p. 5.
International Search Report and Written Opinion—PCT/US2022/073232—ISA/EPO—Oct. 13, 2022.

(Continued)

*Primary Examiner* — Carlo Waje
(74) *Attorney, Agent, or Firm* — Patterson + Sheridan LLP

(57) ABSTRACT

Certain aspects provide an apparatus for signal processing in a neural network. The apparatus generally includes first computation in memory (CIM) cells configured as a first kernel for a neural network computation, the first set of CIM cells comprising one or more first columns and a first plurality of rows of a CIM array. The apparatus also include a second set of CIM cells configured as a second kernel for the neural network computation, the second set of CIM cells comprising the one or more first columns and a second plurality of rows of the CIM array. The first plurality of rows may be different than the second plurality of rows.

19 Claims, 15 Drawing Sheets

(56) References Cited

OTHER PUBLICATIONS

Shaahin A., et al., "DIMA: A Depthwise CNN In-Memory Accelerator," 2018 IEEE/ACM International Conference on Computer-Aided Design (ICCAD), ACM, Nov. 5, 2018 (Nov. 5, 2018), pp. 1-8, XP033487827, DOI: 10.1145/3240765.3240799 [Retrieved on Dec. 24, 2018] Abstract, figures 3-4 section 3, p. 3-p. 5.
Zhezhi H., et al., "Sparse BD-Net," ACM Journal on Emerging Technologies in Computing Systems (JETC), ACM, 2 Penn Plaza, Suite, 701 New York, NY 10121-0701 USA, vol. 16, No. 2, Jan. 29, 2020 (Jan. 29, 2020), pp. 1-24, XP058486715, ISSN: 1550-4832, DOI: 10.1145/3369391 Abstract Section 2; p. 3-p. 5 Section 4, p. 14-p. 20.

* cited by examiner

COMPUTATION IN MEMORY ARCHITECTURE FOR PHASED DEPTH-WISE CONVOLUTIONAL

INTRODUCTION

Aspects of the present disclosure relate to performing machine learning tasks and in particular to computation in memory architectures and dataflows for performing depth-wise separable convolutional in memory.

Machine learning is generally the process of producing a trained model (e.g., an artificial neural network, a tree, or other structures), which represents a generalized fit to a set of training data that is known a priori. Applying the trained model to new data produces inferences, which may be used to gain insights into the new data. In some cases, applying the model to the new data is described as "running an inference" on the new data.

As the use of machine learning has proliferated for enabling various machine learning (or artificial intelligence) tasks, the need for more efficient processing of machine learning model data has arisen. In some cases, dedicated hardware, such as machine learning accelerators, may be used to enhance a processing system's capacity to process machine learning model data. However, such hardware requires space and power, which is not always available on the processing device. For example, "edge processing" devices, such as mobile devices, always on devices, internet of things (IoT) devices, and the like, have to balance processing capabilities with power and packaging constraints. Further, accelerators may need to move data across common data busses, which can cause significant power usage and introduce latency into other processes sharing the data bus. Consequently, other aspects of a processing system are being considered for processing machine learning model data.

Memory devices are one example of another aspect of a processing system that may be leveraged for performing processing of machine learning model data through so-called computation in memory (CIM) processes. Unfortunately, CIM processes may not be able to perform processing of complex model architectures, such as depthwise separable convolutional neural networks, without additional hardware elements, such as digital multiply-and-accumulate circuits (DMACs) and related peripherals. These additional hardware elements use additional space, power, and complexity in their implementation, which tend to reduce the advantages of leveraging the memory device as an additional compute resource. Even where ancillary aspects of a processing system have DMACs available to perform processing that cannot be directly performed in memory, moving the data to and from those ancillary aspects requires time and power and therefore mitigate the benefits of the CIM process.

Accordingly, systems and methods are needed for performing computation in memory of a wider variety of machine learning model architectures, such as depthwise separable convolutional neural networks.

BRIEF SUMMARY

Certain aspects provide an apparatus for signal processing in a neural network. The apparatus generally includes first computation in memory (CIM) cells configured as a first kernel for a depthwise (DW) neural network computation, the first set of CIM cells comprising one or more first columns and a first plurality of rows of a CIM array, a second set of CIM cells configured as a second kernel for the neural network computation, the second set of CIM cells comprising the one or more first columns and a second plurality of rows of the CIM array, wherein the first plurality of rows are different than the second plurality of rows. The apparatus may also include a third set of CIM cells of the CIM array configured as a third kernel for a pointwise (PW) neural network computation.

Certain aspects provide a method for signal processing in a neural network. The method generally includes performing a plurality of DW convolution operations via multiple kernels implemented using multiple CIM cell groups on one or more first columns of a CIM array, and generating input signals for a PW convolution operation based on an output from the plurality of DW convolution operations. The method also includes performing the PW convolution operation based on the input signals, the PW convolution operation being performed via a kernel implemented using a CIM cell group on one or more second columns of the CIM array.

Certain aspects provide a non-transitory computer-readable medium having instructions that, when executed by one or more processors of a processing system, cause the processing system to perform a method of signal processing in neural network. The method generally includes performing a plurality of DW convolution operations via multiple kernels implemented using multiple CIM cell groups on one or more first columns of a CIM array, and generating input signals for a PW convolution operation based on an output from the plurality of DW convolution operations. The method also includes performing the PW convolution operation based on the input signals, the PW convolution operation being performed via a kernel implemented using a CIM cell group on one or more second columns of the CIM array.

Other aspects provide processing systems configured to perform the aforementioned methods as well as those described herein; non-transitory, computer-readable media comprising instructions that, when executed by one or more processors of a processing system, cause the processing system to perform the aforementioned methods as well as those described herein; a computer program product embodied on a computer readable storage medium comprising code for performing the aforementioned methods as well as those further described herein; and a processing system comprising means for performing the aforementioned methods as well as those further described herein.

The following description and the related drawings set forth in detail certain illustrative features of one or more aspects.

BRIEF DESCRIPTION OF THE DRAWINGS

The appended figures depict certain aspects of the one or more aspects and are therefore not to be considered limiting of the scope of this disclosure.

To facilitate understanding, identical reference numerals have been used, where possible, to designate identical elements that are common to the drawings. It is contemplated that elements and features of one aspect may be beneficially incorporated in other aspects without further recitation.

DETAILED DESCRIPTION

Figure 1A:
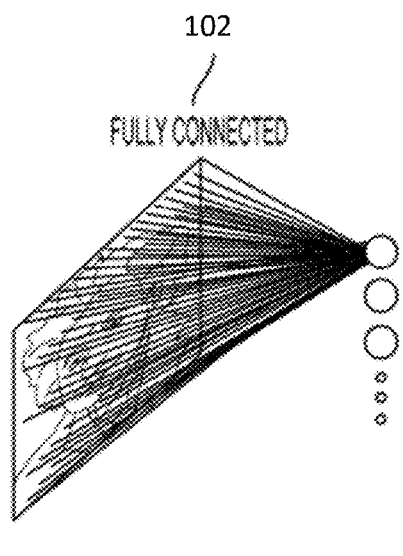
FIGS. 1A-1D depict examples of various types of neural networks.

Aspects of the present disclosure provide apparatuses, methods, processing systems, and computer-readable mediums for performing computation in memory (CIM) of machine learning models, including depthwise (DW) separable convolutional neural networks. Some aspects provide a two phased convolution technique implemented on a CIM array. For example, one of the two phases may include DW convolution operations using kernels implemented on the CIM array, and another one of the two phases may include pointwise (PW) convolution operations using a kernel implemented on the CIM array.

For instance, certain aspects are directed to CIM cells of a CIM array configured for different kernels to be used for DW convolution, where the kernels are implemented on different rows and the same columns of the CIM array. The kernels may be processed using a phase approach, as described herein. The outputs of the cells implementing the kernels may be coupled to an analog-to-digital converter (ADC). The results of the DW computations may be input to a nonlinear activation circuit for further processing and input back to the same CIM array for point-wise computations, as described in more detail herein. The aspects described herein provide flexibility in configuring any CIM array on demand for DW convolution operations, while increasing the number of kernels that can be implemented on a CIM array as compared to conventional implementations, as described in more detail herein.

CIM-based machine learning (ML)/artificial intelligence (AI) task accelerators may be used for a wide variety of tasks, including image and audio processing. Further, CIM may be based on various types of memory architecture, such as dynamic random access memory (DRAM), static random access memory (SRAM) (e.g., based on an SRAM cell as in FIG. 5), magnetoresistive random-access memory (MRAM), and resistive random-access memory (ReRAM), and may be attached to various types of processing units, including central processor units (CPUs), digital signal processors (DSPs), graphical processor units (GPUs), field-programmable gate arrays (FPGAs), AI accelerators, and others. Generally, CIM may beneficially reduce the "memory wall" problem, which is where the movement of data in and out of memory consumes more power than the computation of the data. Thus, by performing the computation in memory, significant power savings may be realized. This is particularly useful for various types of electronic devices, such as lower power edge processing devices, mobile devices, and the like.

For example, a mobile device may include a memory device configured for storing data and compute-in-memory operations. The mobile device may be configured to perform an ML/AI operation based on data generated by the mobile device, such as image data generated by a camera sensor of the mobile device. A memory controller unit (MCU) of the mobile device may thus load weights from another on-board memory (e.g., flash or RAM) into a CIM array of the memory device and allocate input feature buffers and output (e.g., activation) buffers. The processing device may then commence processing of the image data by loading, for example, a layer in the input buffer and processing the layer with weights loaded into the CIM array. This processing may be repeated for each layer of the image data and the output (e.g., activations) may be stored in the output buffers and then used by the mobile device for an ML/AI task, such as facial recognition.

Brief Background on Neural Networks, Deep Neural Networks, and Deep Learning

Neural networks are organized into layers of interconnected nodes. Generally, a node (or neuron) is where computation happens. For example, a node may combine input data with a set of weights (or coefficients) that either amplifies or dampens the input data. The amplification or dampening of the input signals may thus be considered an assignment of relative significances to various inputs with regard to a task the network is trying to learn. Generally, input-weight products are summed (or accumulated) and then the sum is passed through a node's activation function to determine whether and to what extent that signal should progress further through the network.

In a most basic implementation, a neural network may have an input layer, a hidden layer, and an output layer. "Deep" neural networks generally have more than one hidden layer.

Deep learning is a method of training deep neural networks. Generally, deep learning maps inputs to the network to outputs from the network and is thus sometimes referred to as a "universal approximator" because it can learn to approximate an unknown function $f(x)=y$ between any input x and any output y. In other words, deep learning finds the right $f$ to transform x into y.

More particularly, deep learning trains each layer of nodes based on a distinct set of features, which is the output from the previous layer. Thus, with each successive layer of a deep neural network, features become more complex. Deep learning is thus powerful because it can progressively extract higher level features from input data and perform complex tasks, such as object recognition, by learning to represent inputs at successively higher levels of abstraction in each layer, thereby building up a useful feature representation of the input data.

For example, if presented with visual data, a first layer of a deep neural network may learn to recognize relatively simple features, such as edges, in the input data. In another example, if presented with auditory data, the first layer of a deep neural network may learn to recognize spectral power in specific frequencies in the input data. The second layer of the deep neural network may then learn to recognize combinations of features, such as simple shapes for visual data or combinations of sounds for auditory data, based on the output of the first layer. Higher layers may then learn to recognize complex shapes in visual data or words in auditory data. Still higher layers may learn to recognize common visual objects or spoken phrases. Thus, deep learning architectures may perform especially well when applied to problems that have a natural hierarchical structure.

Layer Connectivity in Neural Networks

Neural networks, such as deep neural networks, may be designed with a variety of connectivity patterns between layers.

FIG. 1A illustrates an example of a fully connected neural network 102. In a fully connected neural network 102, a node in a first layer communicate its output to every node in a second layer, so that each node in the second layer will receive input from every node in the first layer.

Figure 1B:
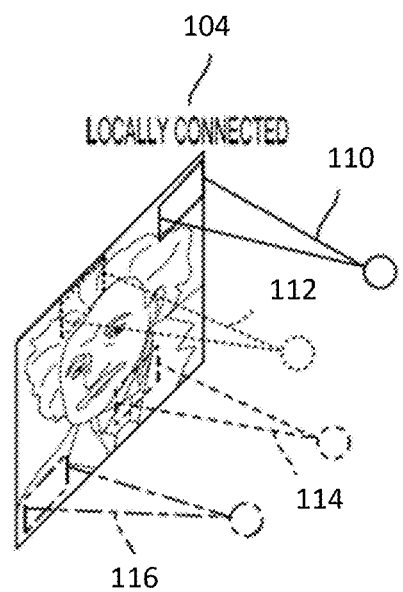

FIG. 1B illustrates an example of a locally connected neural network 104. In a locally connected neural network 104, a node in a first layer may be connected to a limited number of nodes in the second layer. More generally, a locally connected layer of the locally connected neural network 104 may be configured so that each node in a layer will have the same or a similar connectivity pattern, but with connections strengths (or weights) that may have different values (e.g., 110, 112, 114, and 116). The locally connected connectivity pattern may give rise to spatially distinct receptive fields in a higher layer, because the higher layer nodes in a given region may receive inputs that are tuned through training to the properties of a restricted portion of the total input to the network.

Figure 1C:
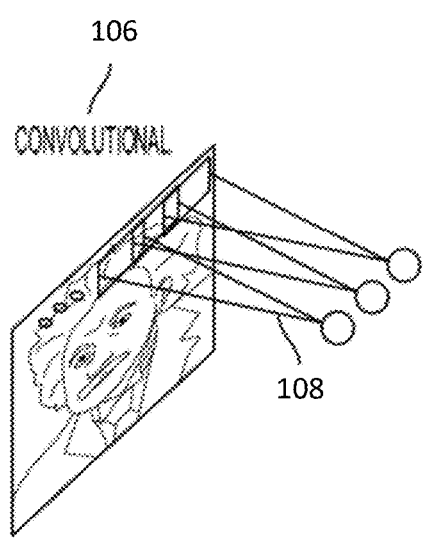

One type of locally connected neural network is a convolutional neural network. FIG. 1C illustrates an example of a convolutional neural network 106. Convolutional neural network 106 may be configured such that the connection strengths associated with the inputs for each node in the second layer are shared (e.g., 108). Convolutional neural networks are well-suited to problems in which the spatial location of inputs is meaningful.

One type of convolutional neural network is a deep convolutional network (DCN). Deep convolutional networks are networks of multiple convolutional layers, which may further be configured with, for example, pooling and normalization layers.

Figure 1D:
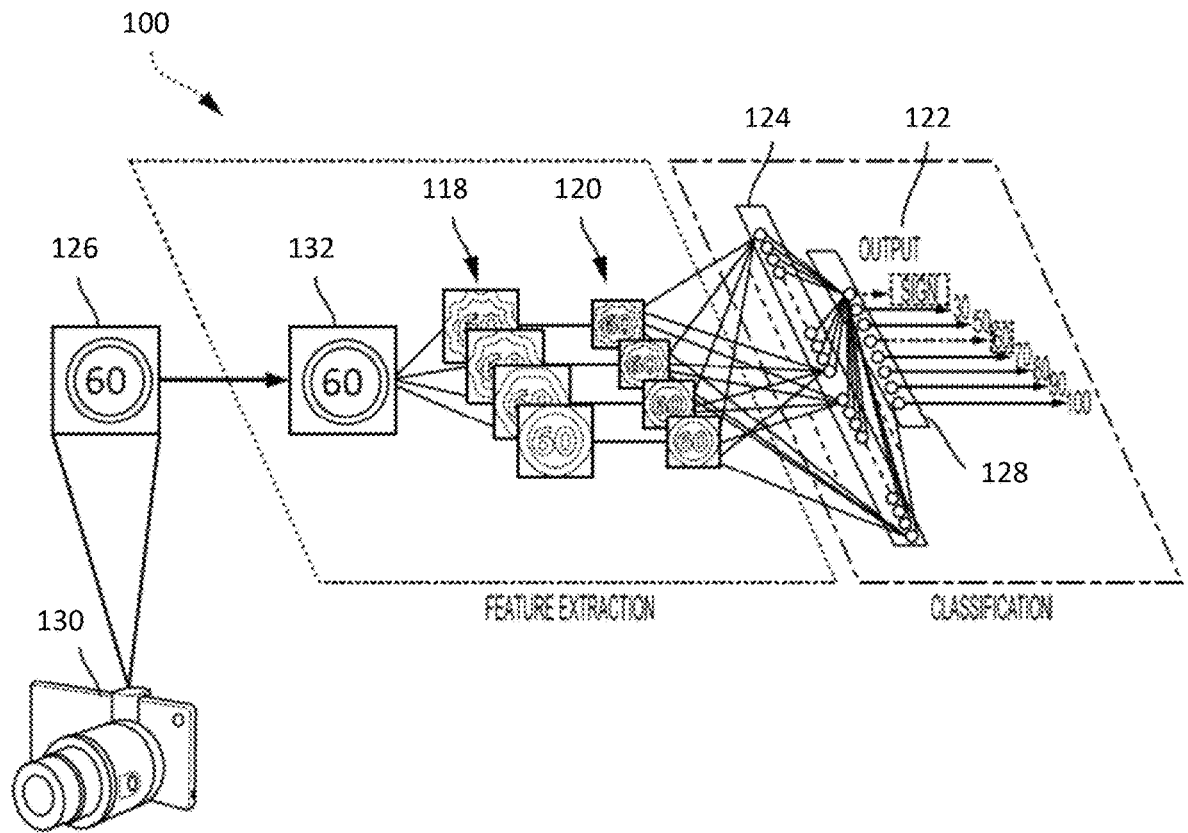

FIG. 1D illustrates an example of a DCN 100 designed to recognize visual features in an image 126 generated by an image capturing device 130. For example, if the image capturing device 130 was a camera mounted in a vehicle, then DCN 100 may be trained with various supervised learning techniques to identify a traffic sign and even a number on the traffic sign. DCN 100 may likewise be trained for other tasks, such as identifying lane markings or identifying traffic lights. These are just some example tasks, and many others are possible.

In this example, DCN 100 includes a feature extraction section and a classification section. Upon receiving the image 126, a convolutional layer 132 applies convolutional kernels (for example, as depicted and described in FIG. 2) to the image 126 to generate a first set of feature maps (or intermediate activations) 118. Generally, a "kernel" or "filter" comprises a multidimensional array of weights designed to emphasize different aspects of an input data channel. In various examples, "kernel" and "filter" may be used interchangeably to refer to sets of weights applied in a convolutional neural network.

The first set of feature maps 118 may then be subsampled by a pooling layer (e.g., a max pooling layer, not shown) to generate a second set of feature maps 120. The pooling layer may reduce the size of the first set of feature maps 118 while maintain much of the information in order to improve model performance. For example, the second set of feature maps 120 may be down-sampled to 14×14 from 28×28 by the pooling layer.

This process may be repeated through many layers. In other words, the second set of feature maps 120 may be further convolved via one or more subsequent convolutional layers (not shown) to generate one or more subsequent sets of feature maps (not shown).

In the example of FIG. 1D, the second set of feature maps 120 is provided to a fully-connected layer 124, which in turn generates an output feature vector 128. Each feature of the output feature vector 128 may include a number that corresponds to a possible feature of the image 126, such as "sign," "60," and "100." In some cases, a softmax function (not shown) may convert the numbers in the output feature vector 128 to a probability. In such cases, an output 122 of the DCN 100 is a probability of the image 126 including one or more features.

Before training DCN 100, the output 122 produced by DCN 100 may be incorrect. Thus, an error may be calculated between the output 122 and a target output known a priori. For example, here the target output is an indication that the image 126 includes a "sign" and the number "60." Utilizing the known, target output, the weights of DCN 100 may then be adjusted through training so that subsequent output 122 of DCN 100 achieves the target output.

To adjust the weights of DCN 100, a learning algorithm may compute a gradient vector for the weights. The gradient may indicate an amount that an error would increase or decrease if a weight were adjusted in a particular way. The weights may then be adjusted to reduce the error. This manner of adjusting the weights may be referred to as "back propagation" as it involves a "backward pass" through the layers of DCN 100.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level.

After training, DCN 100 may be presented with new images and DCN 100 may generate inferences, such as classifications, or probabilities of various features being in the new image.

Convolution Techniques for Convolutional Neural Networks

Convolution is generally used to extract useful features from an input data set. For example, in convolutional neural networks, such as described above, convolution enables the extraction of different features using kernels and/or filters whose weights are automatically learned during training. The extracted features are then combined to make inferences.

An activation function may be applied before and/or after each layer of a convolutional neural network. Activation functions are generally mathematical functions (e.g., equations) that determine the output of a node of a neural network. Thus, the activation function determines whether it a node should pass information or not, based on whether the node's input is relevant to the model's prediction. In one example, where y=conv(x) (i.e., y=a convolution of x), both x and y may be generally considered as "activations." However, in terms of a particular convolution operation, x may also be referred to as "pre-activations" or "input activations" as it exists before the particular convolution and y may be referred to as output activations or a feature map.

Figure 2:
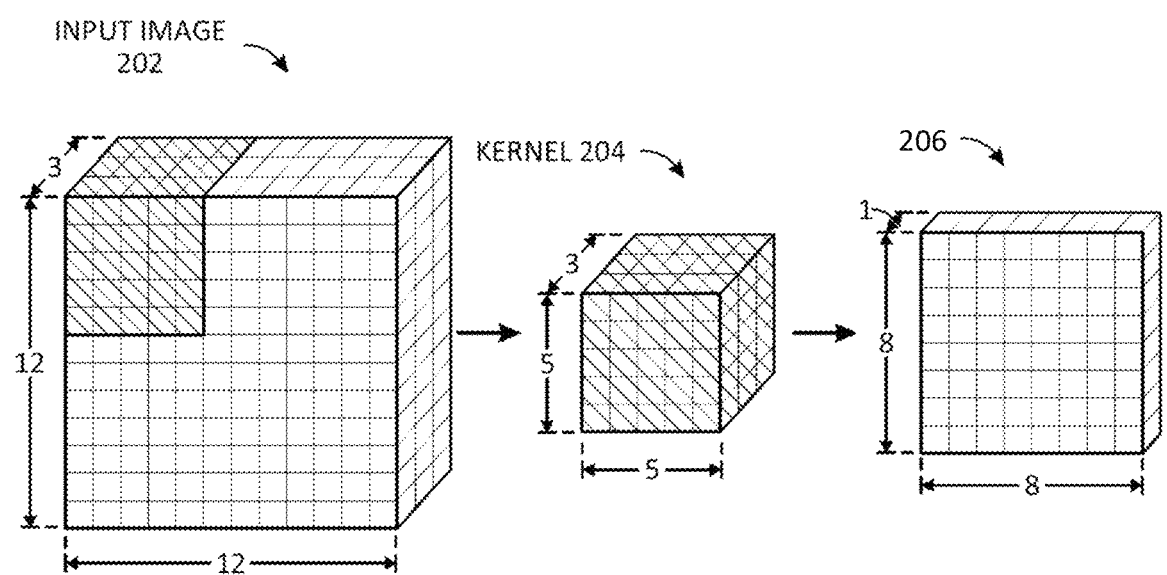
FIG. 2 depicts an example of a conventional convolution operation.

FIG. 2 depicts an example of a traditional convolution in which a 12 pixel×12 pixel×3 channel input image is convolved using a 5×5×3 convolution kernel 204 and a stride (or step size) of 1. The resulting feature map 206 is 8 pixels×8 pixels×1 channel. As seen in this example, the traditional convolution may change the dimensionality of the input data as compared to the output data (here, from 12×12 to 8×8 pixels), including the channel dimensionality (here, from 3 to 1 channel).

Figure 3A:
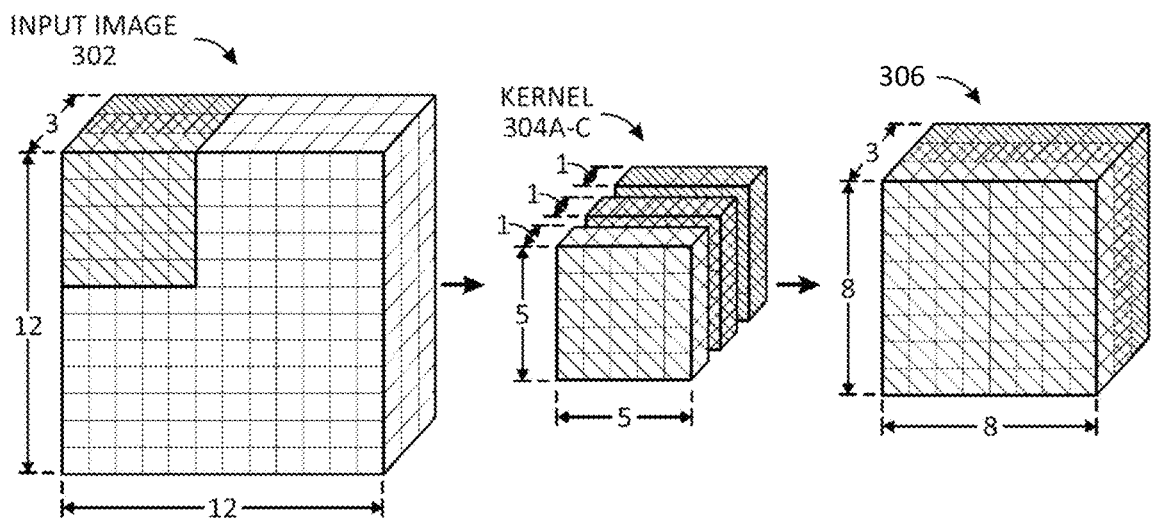
FIGS. 3A and 3B depicts examples of depthwise separable convolution operations.
Figure 3B:
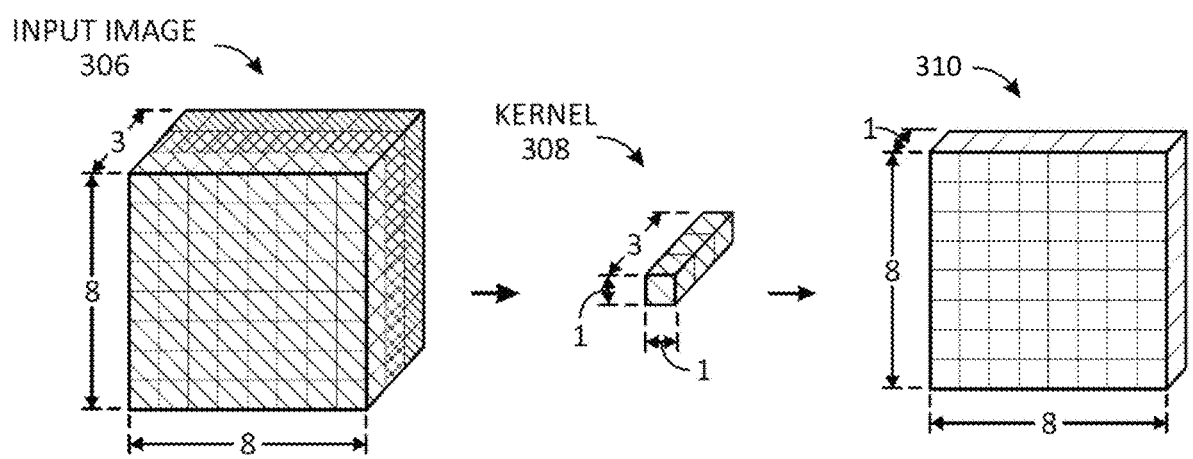

One way to reduce the computational burden (e.g., measured in floating point operations per second (FLOPs)) and the number parameters associated with a neural network comprising convolutional layers is to factorize the convolutional layers. For example, a spatial separable convolution, such as depicted in FIG. 2, may be factorized into two components: (1) a depthwise convolution, wherein each spatial channel is convolved independently by a depthwise convolution (e.g., a spatial fusion); and (2) a pointwise convolution, wherein all the spatial channels are linearly combined (e.g., a channel fusion). An examples of a depthwise separable convolution is depicted in FIGS. 3A and 3B. Generally, during spatial fusion, a network learns features from the spatial planes and during channel fusion the network learns relations between these features across channels.

In one example, a separable depthwise convolutions may be implemented using 3×3 kernels for spatial fusion, and 1×1 kernels for channel fusion. In particular, the channel fusion may use a 1×1×d kernel that iterates through every single point in an input image of depth d, wherein the depth d of the kernel generally matches the number of channels of the input image. Channel fusion via pointwise convolution is useful for dimensionality reduction for efficient computations. Applying 1×1×d kernels and adding an activation layer after the kernel may give a network added depth, which may increase its performance.

FIGS. 3A and 3B depicts an example of a depthwise separable convolution operation.

In particular, in FIG. 3A, the 12 pixel×12 pixel×3 channel input image 302 is convolved with a filter comprising three separate kernels 304A-C, each having a 5×5×1 dimensionality, to generate a feature map 306 of 8 pixels×8 pixels×3 channels, where each channel is generated by an individual kernel amongst 304A-C.

Then feature map 306 is further convolved using a pointwise convolution operation in which a kernel 308 (e.g., kernel) having dimensionality 1×1×3 to generate a feature map 310 of 8 pixels×8 pixels×1 channel. As is depicted in this example, feature map 310 has reduced dimensionality (1 channel versus 3), which allows for more efficient computations with feature map 310. In some aspects of the present disclosure, the kernels 304A-C and kernel 308 may be implemented using the same computation-in-memory (CIM) array, as described in more detail herein.

Though the result of the depthwise separable convolution in FIGS. 3A and 3B is substantially similar to the conventional convolution in FIG. 2, the number of computations is significantly reduced, and thus depthwise separable convolution offers a significant efficiency gain where a network design allows it.

Though not depicted in FIG. 3B, multiple (e.g., m) pointwise convolution kernels 308 (e.g., individual components of a filter) can be used to increase the channel dimensionality of the convolution output. So, for example, m=256 1×1×3 kernels 308 can be generated, which each output an 8 pixels×8 pixels×1 channel feature map (e.g., 310), and these feature maps can be stacked to get a resulting feature map of 8 pixels×8 pixels×256 channels. The resulting increase in channel dimensionality provides more parameters for training, which may improve a convolutional neural network's ability to identify features (e.g., in input image 302).

Example Compute in Memory (CIM) Architecture

Figure 4:
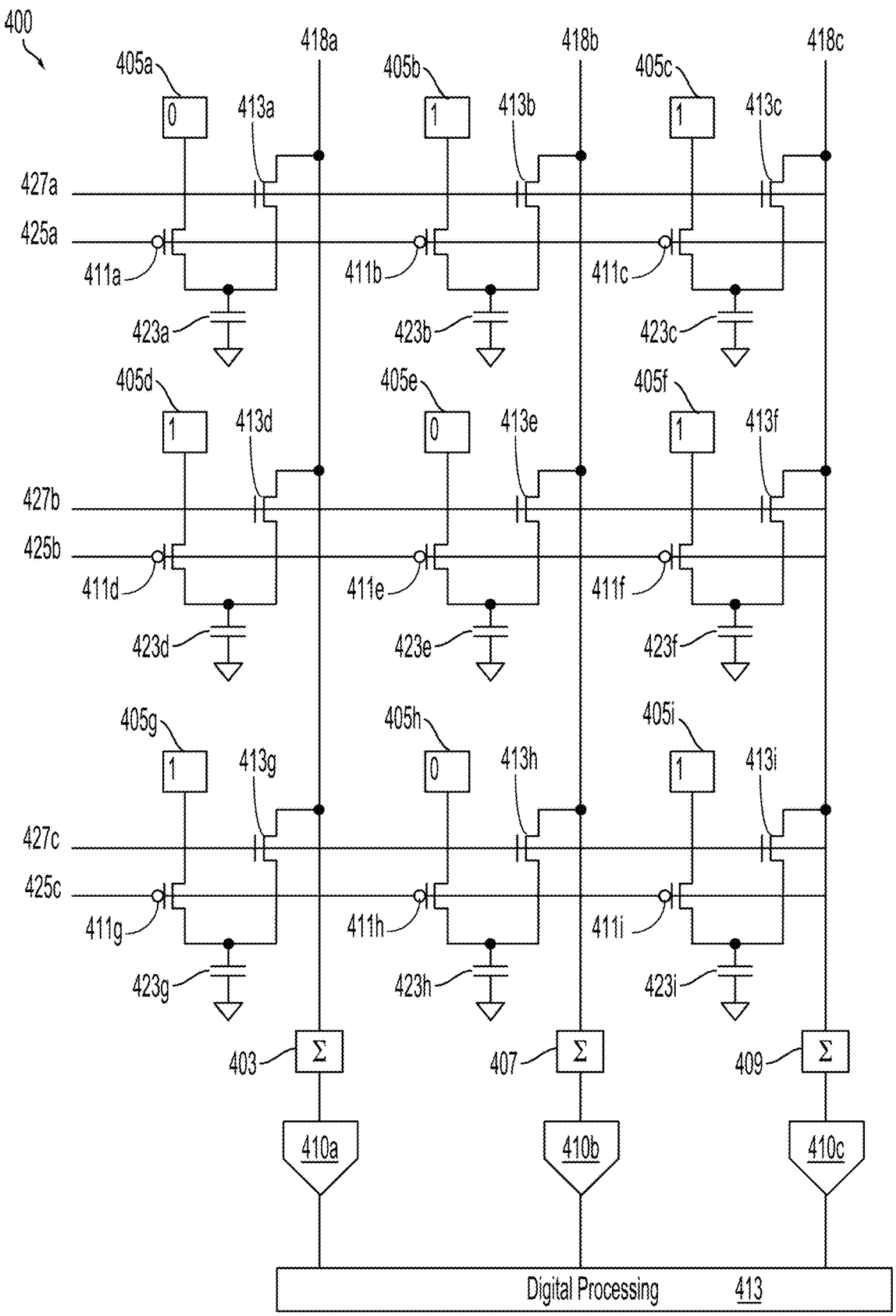
FIG. 4 illustrates an example compute-in-memory (CIM) array configured for performing machine learning model computations.

FIG. 4 illustrates an exemplary compute-in-memory (CIM) array 400 configured for performing machine learning model computations, according to aspects of the present disclosure. In this example, CIM array 400 is configured to simulate MAC operations using mixed analog/digital operations for an artificial neural network. Accordingly, as used herein, the terms multiplication and addition may refer to such simulated operations. CIM array 400 can be used to implement aspects of the processing techniques described herein.

In the depicted aspect, CIM array 400 includes precharge word lines (PCWLs) 425$a$, 425$b$ and 425$c$ (collectively 425), read word lines (RWLs) 427$a$, 427$b$, and 427$c$ (collectively 427), analog-to-digital converters (ADCs) 410$a$, 410$b$ and 410$c$, (collectively 410), a digital processing unit 413, bitlines 418$a$, 418$b$, and 418$c$ (collectively 418), PMOS transistors 411$a$-111$i$ (collectively 411), NMOS transistors 413$a$-413$i$ (collectively 413), and capacitors 423$a$-423$i$ (collectively 423).

Weights associated with a neural network layer may be stored in SRAM cells of CIM array 400. In this example, binary weights are shown in the SRAM bitcells 405$a$-405$i$ of CIM array 400. Input activations (e.g., input values that may be an input vector) are provided on the PCWLs 425$a$-$c$.

Multiplication occurs in each bitcell 405$a$-405$i$ of CIM array 400 associated with a bitline and the accumulation (summation) of all the bitcell multiplication results occurs on the same bitline for one column. The multiplication in each bitcell 405$a$-405$i$ is in the form of an operation equivalent to an AND operation of the corresponding activation and weight, where the result is stored as a charge on the corresponding capacitor 423. For example, a product of 1, and consequently a charge on the capacitor 423, is produced only where the activation is one (here, because a PMOS is used, the PCWL is zero for an activation of one) and the weight is one.

For example, in an accumulating stage, RWLs 427 are switched to high so that any charges on capacitors 423 (which is based on corresponding bitcell (weight) and PCWL (activation) values) can be accumulated on corresponding bitlines 418. The voltage values of the accumulated charges are then converted by ADCs 410 to digital values (where, for example, the output values may be a binary value indicating whether the total charge is greater than a reference voltage). These digital values (outputs) may be provided as input to another aspect of a machine learning model, such as a following layer.

When activations on precharge word lines (PCWLs) 425$a$, 425$b$ and 425$c$ are, for example, 1, 0, 1, then the sums of bitlines 418$a$-$c$ correspond to 0+0+1=1, 1+0+0=1, and 1+0+1=2, respectively. The output of the ADCs 410$a$, 410$b$ and 410c are passed on to the digital processing unit 413 for further processing. For example, if CIM 100 is processing multi-bit weight values, the digital outputs of ADCs 110 may be summed to generate a final output.

The exemplary 3×3 CIM circuit 400 may be used, for example, for performing efficient 3-channel convolution for three-element kernels (or filters), where the weights of each kernel correspond to the elements of each of the three columns, so that for a given three-element receptive field (or input data patch), the outputs for each of the three channels are calculated in parallel.

Notably, while FIG. 4 describes an example of CIM using SRAM cells, other memory types can be used. For example, dynamic random access memory (DRAM), magnetoresistive random-access memory (MRAM), and resistive random-access memory (ReRAM or RRAM) can likewise be used in other embodiments.

Figure 5A:
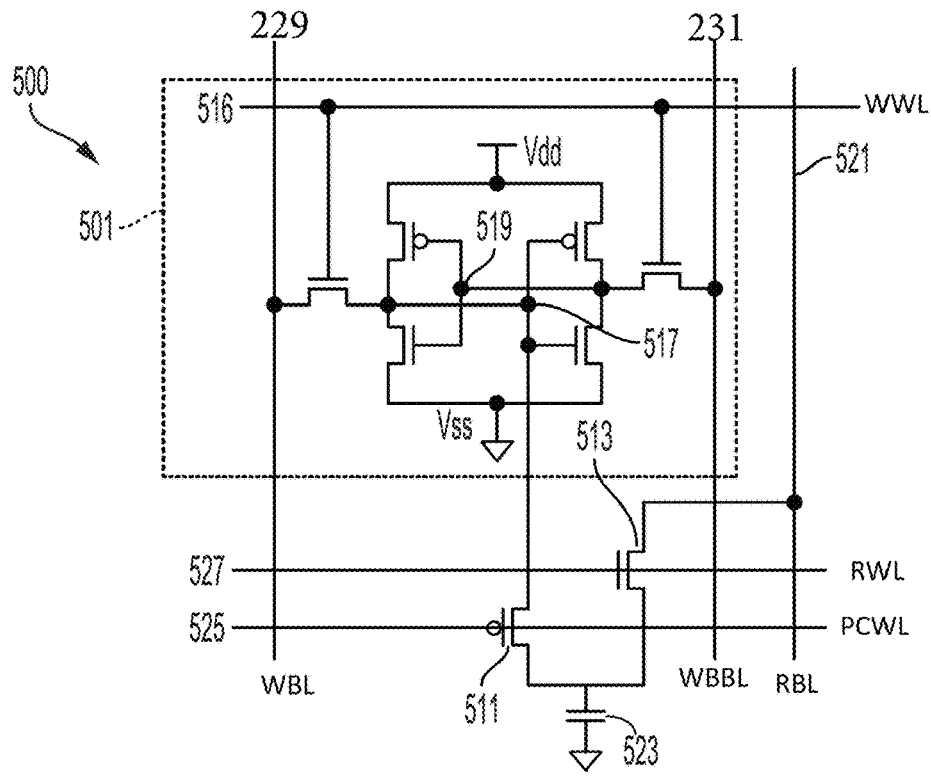
FIGS. 5A and 5B depict additional details of exemplary bit cells, which may be representative of the bitccells in FIG. 4.

FIG. 5A depicts additional details of an exemplary bitcell 500.

Aspects of FIG. 5A may be exemplary of or otherwise relate to aspect of FIG. 4. In particular, bitline 521 is similar to the bitline 418a, a capacitor 523 is similar to the capacitor 423 of FIG. 4, a read word line 527 is similar to the read word line 427a of FIG. 4, and a pre-charge word line 525 is similar to the pre-charge word line 425a of FIG. 4, PMOS transistor 511 is similar to PMOS transistor 411a of FIG. 1, and NMOS transistor 513 is similar to NMOS transistor 413 of FIG. 1.

The bitcell 500 includes a static random access memory (SRAM) cell 501, which may be representative of SRAM bitcells 405a of FIG. 4, as well as transistor 511 (e.g., a PMOS transistor), and transistor 513 (e.g., an NMOS transistor) and capacitor 523 coupled to ground. Although a PMOS transistor is used for the transistor 511, other transistors (e.g., an NMOS transistor) can be used in place of the PMOS transistor, with corresponding adjustment (e.g., inversion) of their respective control signals. The same applies to the other transistors described herein. The additional transistors 511 and 513 are included to implement the compute-in-memory array, according to aspects of the present disclosure. In one aspect, the SRAM cell 501 is a conventional six transistor (6T) SRAM cell.

Programming of weights in the bitcell may be performed once for a multitude of activations. For example, in operation, the SRAM cell 501 receives only one bit of information at nodes 517 and 519 via a write word line (WWL) 516. For example, during write (when WWL 516 is high), if write bit line (WBL) 229 is high (e.g., "1"), then node 517 sets to high and node 519 sets to low (e.g., "0"); or if WBL 229 is low, then node 517 sets to low and node 519 sets to high. Conversely, during write (when WWL 516 is high), if write bit bar line (WBBL) 231 is high, then node 517 sets to low and node 519 sets to high; or if WBBL 229 is low, then node 517 sets to high and node 519 sets to low.

The programming of weights may be followed by an an activation input and multiplication step to charge the capacitors in accordance with the corresponding products. For example, the transistor 511 is activated by an activation signal (PCWL signal) through a pre-charge word line (PCWL) 525 of the compute-in-memory array to perform the multiplication step. Then the transistor 513 is activated by a signal through another word line (e.g., a read word line (RWL) 527) of the compute-in-memory array to perform the accumulation of the multiplication value from bitcell 500 with other bitcells of an array, such as described above with respect to FIG. 4.

If node 517 is a "0," (e.g., when the stored weight value is "0") the capacitor 523 will not be charged if a low PCWL indicates an activation of "1" at the gate of the transistor 511. Accordingly, no charge is provided to a bitline 521. However, if node 517, which corresponds to the weight value, is a "1", and PCWL is set to low (e.g., when the activation input is high), which turns on PMOS transistor 511, which acts as a short, allowing capacitor 523 to be charged. After the capacitor 523 is charged, the transistor 511 is turned off so the charge is stored in the capacitor 523. To move the charge from the capacitor 523 to the bitline 521, the NMOS transistor 513 is turned on by RWL 527 causing the NMOS transistor 513 to act as a short.

Table 1 illustrates an example of compute-in-memory array operations according to an AND operational setting, such as may be implemented by bitcell 500 in FIG. 5A.

TABLE 1

| AND Operation | | | |
|---|---|---|---|
| Activation | PCWL | Cell Node (Weight) | Capacitor Node |
| 1 | 0 | 1 | 1 |
| 1 | 0 | 0 | 0 |
| 0 | 1 | 1 | 0 |
| 0 | 1 | 0 | 0 |

A first column (Activation) of Table 1 includes possible values of an incoming activation signal.

A second column (PCWL) of Table 1 includes PCWL values that activate transistors designed to implement compute-in-memory functions according to aspects of the present disclosure. Because the transistor 511 in this example is a PMOS transistor, the PCWL values are inverses of the activation values. For example, the compute-in-memory array includes the transistor 511 that is activated by an activation signal (PCWL signal) through the pre-charge word line (PCWL) 525.

A third column (Cell Node) of Table 1 includes weight values stored in the SRAM cell node, for example, corresponding to weights in a weight tensor, such as a may be used in convolution operations.

A fourth column (Capacitor Node) of Table 1 shows the resultant products that will be stored as charge on a capacitor. For example, the charge may be stored at a node of the capacitor 523 or a node of one of the capacitors 423a-423i. The charge from the capacitor 523 is moved to the bitline 521 when the transistor 513 is activated. For example, referring to the transistor 511, when the weight at the cell node 517 is a "1" (e.g., high voltage) and the input activation is a "1" (so PCWL is "0"), the capacitor 523 is charged (e.g., the node of the capacitor is a "1"). For all other combinations, the capacitor node will have a value of 0.

Figure 5B:
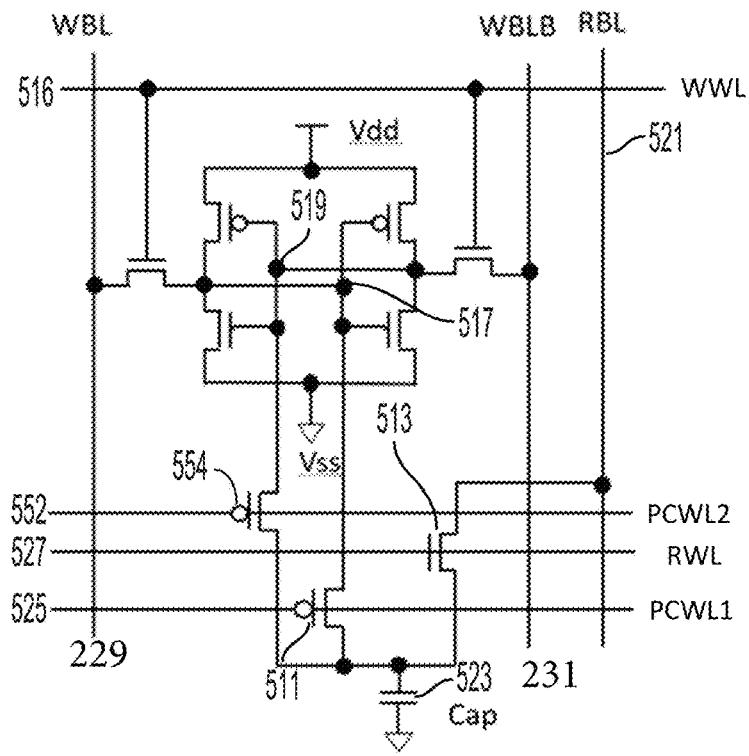

FIG. 5B depicts additional details of another exemplary bitcell 550.

Bitcell 550 differs from bitcell 500 in FIG. 5A primarily based on the inclusion of an additional pre-charge word line 552 coupled to an additional transistor 554.

Table 2 illustrates an example of compute-in-memory array operations similar to Table 1, except according to an XNOR operational setting, such as may be implemented by bitcell 550 in FIG. 5B.

TABLE 2

| | | | Cell Node | Capacitor |
| Activation | PCWL1 | PCWL2 | (Weight) | Node |
| --- | --- | --- | --- | --- |
| 1 | 0 | 1 | 1 | 1 |
| 1 | 0 | 1 | 0 | 0 |
| 0 | 1 | 0 | 1 | 0 |
| 0 | 1 | 0 | 0 | 1 |

A first column (Activation) of Table 2 includes possible values of an incoming activation signal.

A second column (PCWL1) of Table 2 includes PCWL1 values that activate transistors designed to implement compute-in-memory functions according to aspects of the present disclosure. Here again, the transistor 511 is a PMOS transistor, the PCWL1 values are inverses of the activation values.

A third column (PCWL2) of Table 2 includes PCWL2 values that activate further transistors designed to implement compute-in-memory functions according to aspects of the present disclosure.

A fourth column (Cell Node) of Table 2 includes weight values stored in the SRAM cell node, for example, corresponding to weights in a weight tensor, such as a may be used in convolution operations.

A fifth column (Capacitor Node) of Table 2 shows the resultant products that will be stored as charge on a capacitor, such as capacitor 523.

Figure 6:
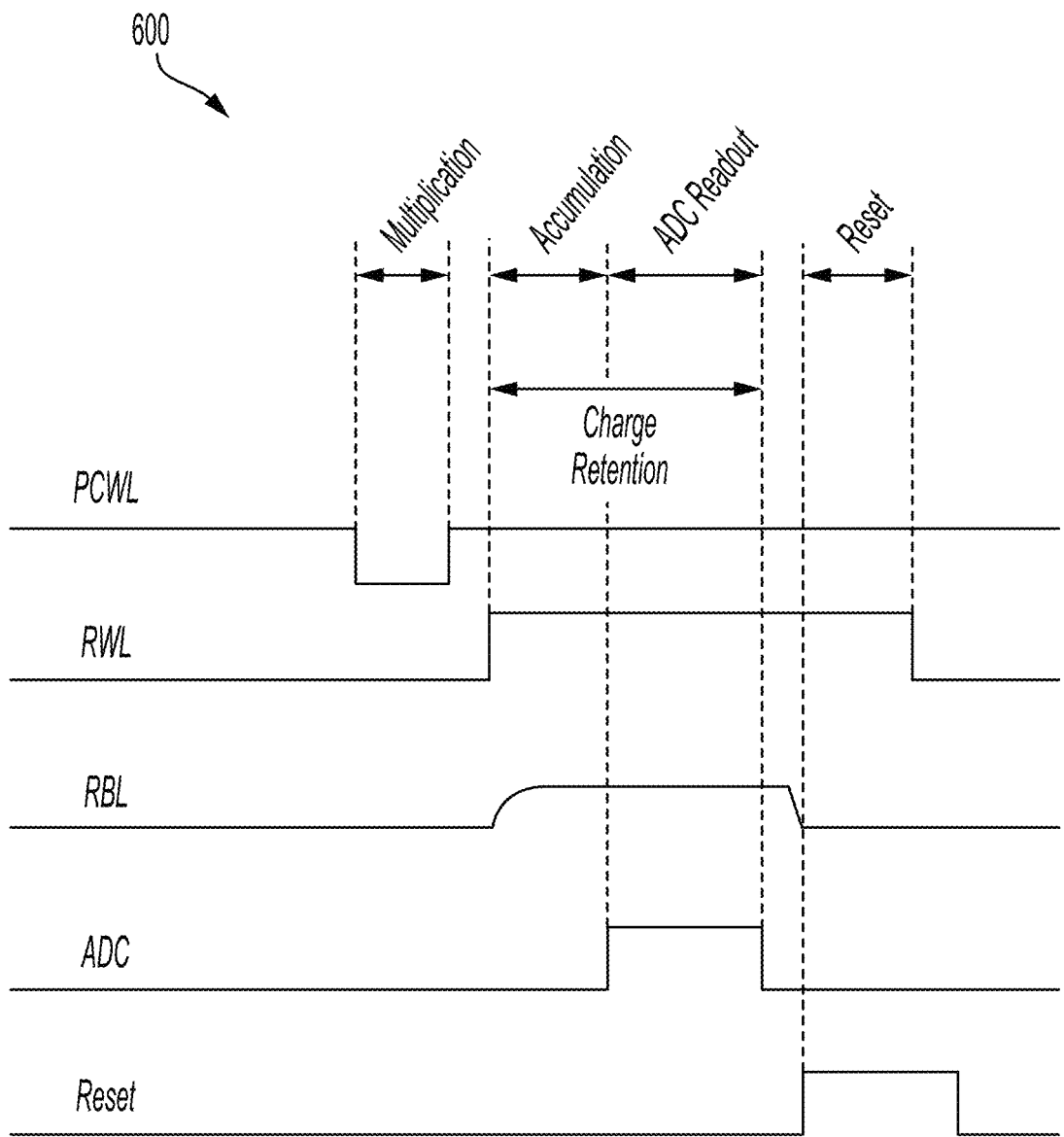
FIG. 6 depicts an example timing diagram of various signals during a CIM array operation.

FIG. 6 depicts an example timing diagram 600 of various signals during a compute-in-memory (CIM) array operation.

In the depicted example, a first row of the timing diagram 600 shows a pre-charge word line PCWL (e.g., 425a of FIG. 4 or 525 of FIG. 5A), going low. In this example, a low PCWL indicates an activation of "1." The PMOS transistor turns on when PCWL is low, which allows charging of the capacitor (if the weight is "1"). A second row shows a read word line RWL (e.g., read word line 427a of FIG. 4 or 527 of FIG. 5A.) A third row shows a read bitline RBL (e.g. 418 of FIG. 4 or 521 of FIG. 5A), a fourth row shows an analog-to-digital converter (ADC) readout signal and a fifth row shows a reset signal.

For example, referring to the transistor 511 of FIG. 5A, a charge from the capacitor 523 is gradually passed on to the read bitline RBL when the read word line RWL is high.

A summed charge/current/voltage (e.g., 403 of FIG. 4 or charges summed from the the bitline 521 of FIG. 5A) is passed on to a comparator or ADC (e.g., the ADC 411 of FIG. 4) where the summed charge is converted to a digital output (e.g., digital signal/number). The summing of the charge may occur in an accumulation region of the timing diagram 600 and a readout from the ADC may be associated with the ADC readout region of the timing diagram 600. After the ADC readout is obtained, the reset signal discharges all of the capacitors (e.g., capacitors 423a-423i) in preparation for processing the next set of activation inputs.

Example of Convolution Processing in Memory

Figure 7:
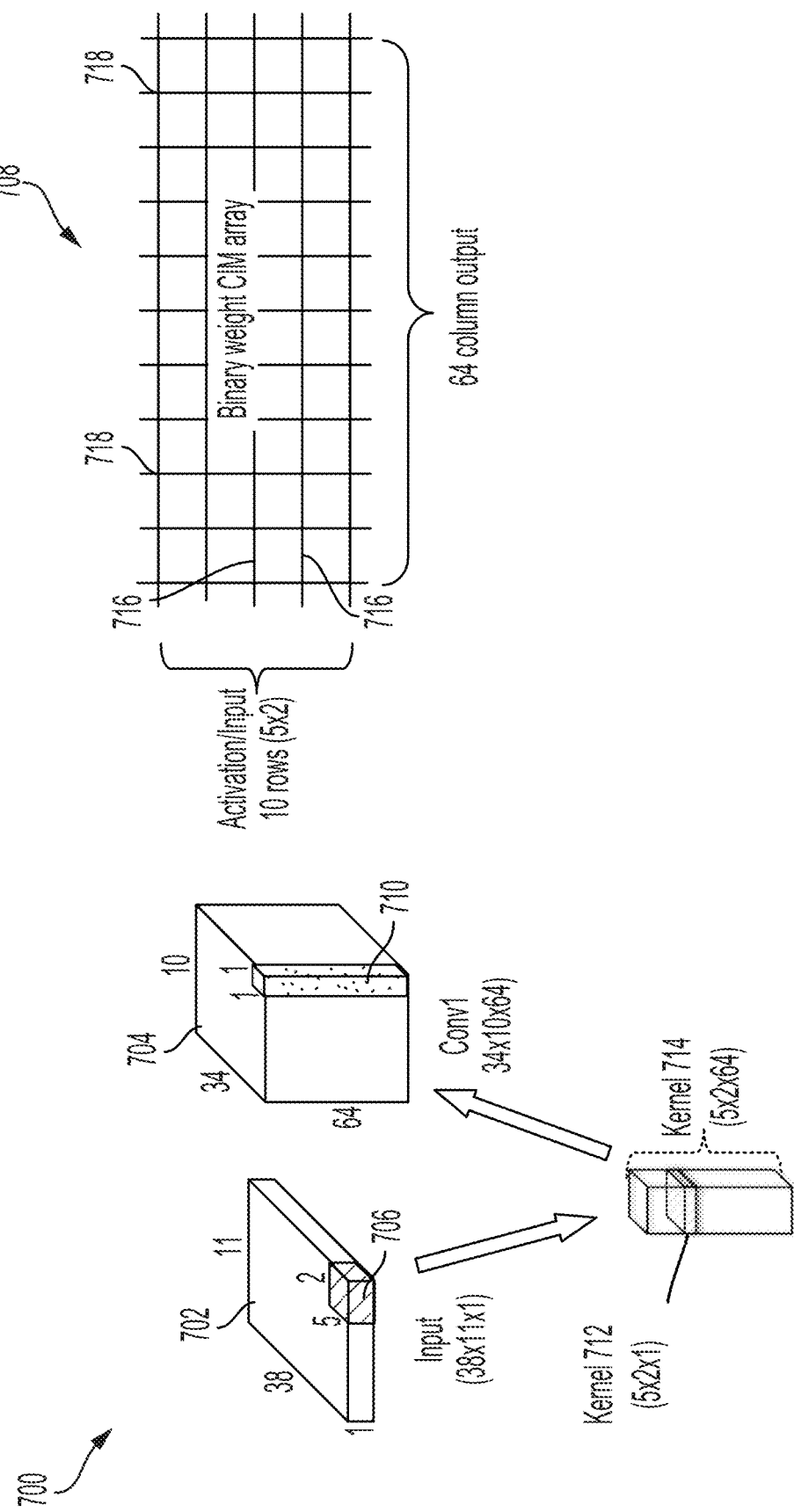
FIG. 7 depicts an exemplary convolutional layer architecture implemented by a CIM array.

FIG. 7 depicts an exemplary convolutional layer architecture 700 implemented by a compute-in-memory (CIM) array 708. The convolutional layer architecture 700 may be a part of a convolutional neural network (e.g., as described above with respect to FIG. 1D) and designed to process multidimensional data, such as tensor data.

In the depicted example, input 702 to the convolutional layer architecture 700 has dimensions of 38 (height)×11 (width)×1 (depth). The output 704 of the convolutional layer has dimensions 34×10×64, which includes 64 output channels corresponding to the 64 kernels of kernel tensor 714 applied as part of the convolution process. Further in this example, each kernel (e.g., exemplary kernel 712) of the 64 kernels of kernel tensor 714 has dimensions of 5×2×1 (all together, the kernels of filter tensor 714 are equivalent to one 5×2×64 kernel).

During the convolution process, each 5×2×1 kernel is convolved with the input 702 to generate one 34×10×1 layer of output 704. During the convolution, the 640 weights of kernel tensor 714 (5×2×64) may be stored in the compute-in-memory (CIM) array 708, which in this example includes a column for each kernel (i.e., 64 columns). Then activations of each of the 5×2 receptive fields (e.g., receptive field input 706) are input to the CIM array 708 using the word lines, e.g., 716, and multiplied by the corresponding weights to produce a 1×1×64 output tensor (e.g., an output tensor 710). Output tensors 704 represent an accumulation of the 1×1×64 individual output tensors for all of the receptive fields (e.g., the receptive field input 706) of the input 702. For simplicity, the compute-in-memory array 708 of FIG. 7 only shows a few illustrative lines for the input and the output of the compute-in-memory array 708.

In the depicted example, CIM array 708 includes wordlines 716 through which the CIM array 708 receives the receptive fields (e.g., receptive field input 706), as well as bitlines 718 (corresponding to the columns of the CIM array 708). Though not depicted, CIM array 708 may also include pre-charge wordlines (PCWL) and read word lines RWL (as described above with respect to FIGS. 4 and 5).

In this example, wordlines 716 are used for initial weight definition. However, once the initial weight definition occurs, the activation input activates a specially designed line in a CIM bitcell to perform a MAC operation. Thus, each intersection of a bitline 718 and a wordline 716 represents a kernel weight value, which is multiplied by the input activation on the wordline 716 to generate a product. The individual products along each bitline 718 are then summed to generate corresponding output values of the output tensor 710. The summed value may be charge, current, or voltage. In this example, the dimensions of the output tensor 704, after processing the entire input 702 of the convolutional layer, are 34×10×64, though only 64 kernel outputs are generated at a time by the CIM array 708. Thus, the processing of the entire input 702 may be completed in 34×10 or 340 cycles.

CIM Architectures for Depthwise Separable Convolution

Vector-matrix multiplication blocks implemented in memory for CIM architectures can perform conventional convolutional neural network processing generally well, but they are not efficient for supporting depthwise separable convolutional neural networks, which are found in many state of the art machine learning architectures.

Conventional solutions for improving efficiency include adding a separate digital MAC block to handle processing for the depthwise portion of a separable convolution while a CIM array can handle the pointwise portion of the separable convolution. However, this hybrid approach results in increased data movement, which can offset the memory efficient advantage of the CIM architecture. Further, the hybrid approach generally involves additional hardware (e.g., the digital multiply-and-accumulate (DMAC) element), which increases space and power needs, and increases processing latency. Moreover, the use of DMACs may impact timing of processing operations and cause model output timing constraints (or other dependencies) to be overrun. In order to resolve that issue, various compromises may be made, such as reducing the frame rate of incoming data, increasing the clock rate of processing system elements (including a CIM array), reducing input feature size, and others.

The CIM architectures described herein improve timing performance of processing operations for depthwise separable convolutions. These improvements beneficially result in less cycle time for depthwise separable convolution operations and achieve higher total operations per second (TOPS) per watt of processing power, i.e., TOPS/W, compared to conventional architectures that require more hardware (e.g., DMACs) and/or more data movement.

Figure 8A:
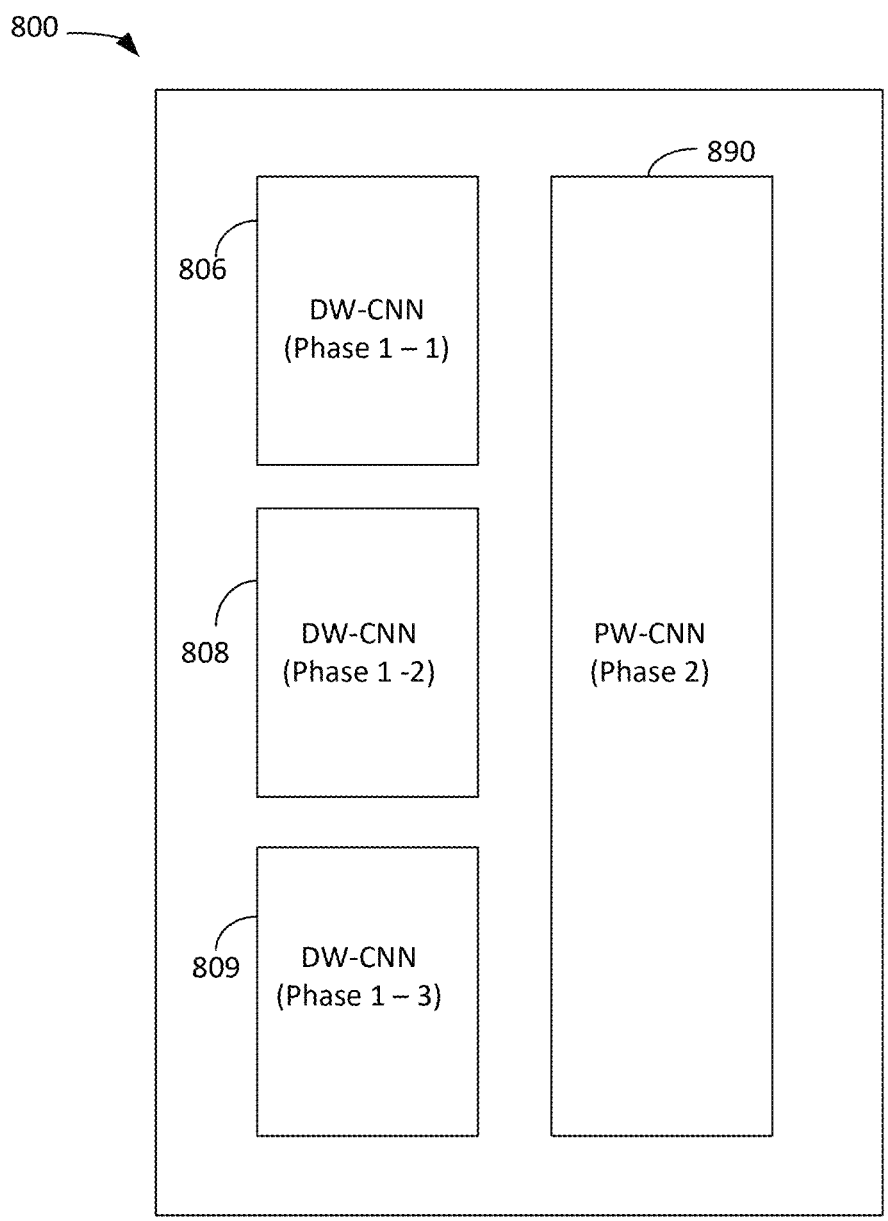
FIGS. 8A and 8B illustrate a CIM architecture including a CIM array, in accordance with certain aspects of the present disclosure.
Figure 8B:
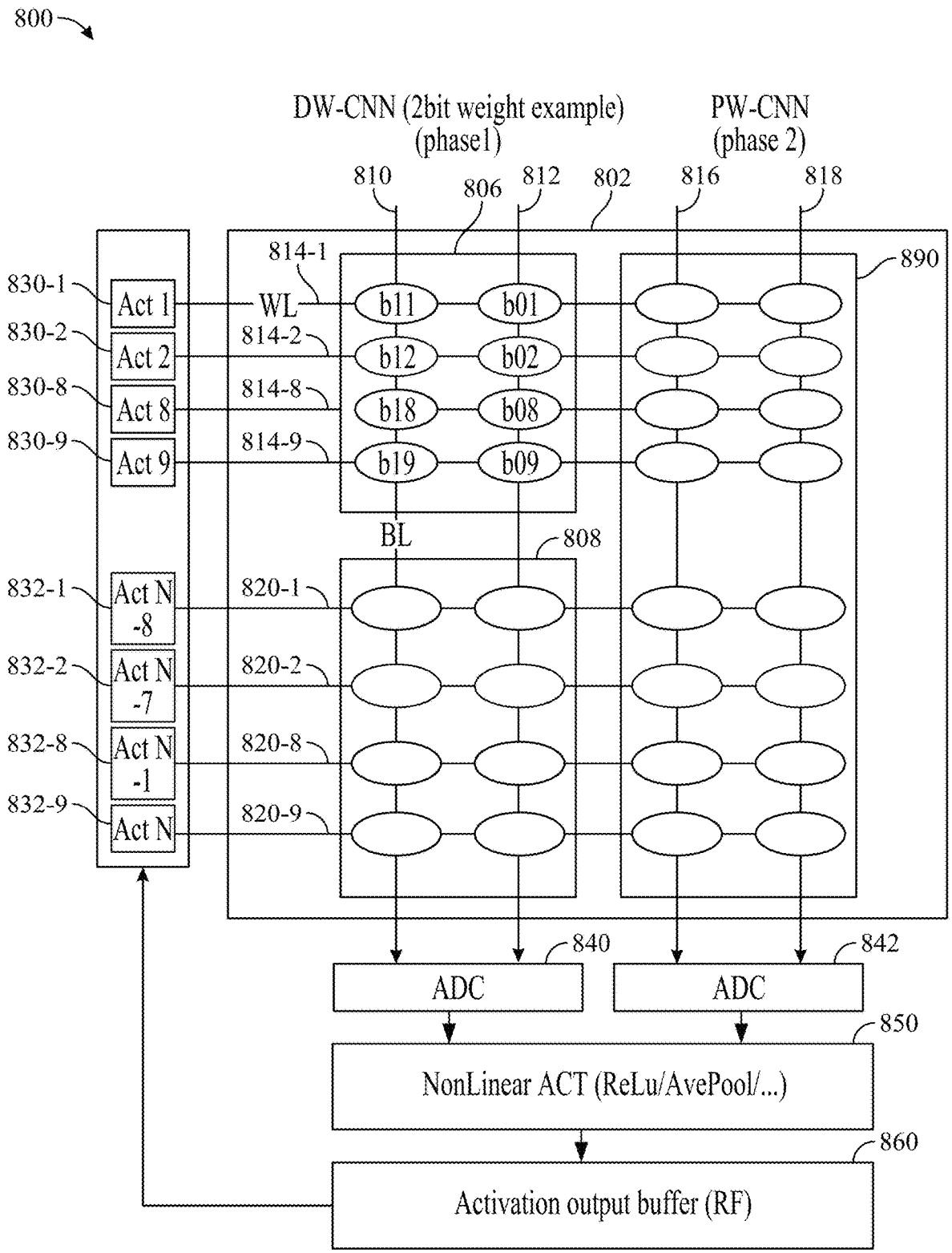

FIGS. 8A and 8B illustrates a CIM system 800 including a CIM array 802, in accordance with certain aspects of the present disclosure. As illustrated in FIG. 8A, the CIM array 802 may be used to implement kernels 806, 808, 809 for DW convolution operations, and kernel 890 for the PW convolution operations. For example, kernels 806, 808, 809 may correspond to kernels 304A, 304B, 304C, respectively, and kernel 890 may correspond to kernel 308, as described with respect to FIGS. 3A and 3B. The DW convolution operations may be performed sequentially during a first phase (phase 1). For instance, during phase 1-1, the kernel 806 may be processed, during phase 1-2, the kernel 808 may be processed, and during phase 1-3, the kernel 809 may be processed. The output of the DW convolution operations for the kernels 806, 808, 809 may be used to generate the inputs for kernel 890 to perform a PW convolution operation in a second phase. In this manner, both DW convolution and PW convolution operations may be performed using kernels implemented on a single CIM array. The DW kernels may be implemented on the same columns of the CIM array, allowing a greater number of DW kernels to be implemented on the CIM array as compared to conventional implementations.

As illustrated in FIG. 8B, the CIM system 800 includes a CIM array 802 configured for DW convolution neural network calculations and pointwise (PW)-CNN calculations (e.g., CNN 1×1). Kernels for DW convolution operations and PW convolution operation may be implemented on different groups of columns and activated separately during different phases, as described with respect to FIG. 8A. In some aspects, kernels (e.g., 3×3 kernels) may be implemented on the same columns (also referred to herein as bit-lines) of the CIM array 802. For example, a 3×3 kernel 806 of two-bit weights (i.e., nine two-bit values including a first two-bit value b01, b11, a second two-bit value b02, b12, and so on) may be implemented using CIM cells on columns 810, 812 (e.g., one column for each bit width of the weights) and nine rows 814-1, 814-2 to 814-8, and 814-9 (e.g., also referred to herein as word-lines (WLs), collectively referred to as rows 814, where there is one row for each value in the kernel). Another kernel 808 may be implemented on columns 810, 812 and nine rows 820-1 to 820-9 (collectively referred to as rows 820) to implement another 3×3 filter. Thus, the kernels 806 and 808 are implemented on different rows, but on the same columns. As a result, the kernels 806 and 808 may be operated sequentially. In other words, activating the rows for one of the kernels 806, 808 does not impact the rows of the other one of the kernels 806, 808. However, activating the columns for one of the kernels 806, 808 impacts the columns of the other one of the kernels 806, 808. Therefore, the kernels 806, 808 may be operated sequentially. While only two kernels 806 and 808 are shown, more than two kernels may be implemented in some aspects. For example, kernels 806, 808, 809 shown in FIG. 8A may be implemented in CIM array 802.

In some aspects, each kernel's input activation buffer is filled (e.g., stored) with the corresponding output from previous layers. Each kernel may be operated sequentially one-by-one to generate DW convolution output. The inactive kernel's input may be filled with zero (e.g., logic low) such that the read BL (RBL) output of the inactive kernel is zero (e.g., as supported in a ternary mode bit cell). In this manner, the inactive kernel may not impact the output from the active kernel implemented on the columns (BLs).

In some aspects, the rows (e.g., rows 814) for the kernel 806 may be coupled to activation buffers 830-1, 830-2 to 830-8, and 830-9 (collectively referred to as activation buffers 830), and the rows (e.g., rows 820) for the kernel 808 may be coupled to activation buffers 832-1 to 832-9 (collectively referred to as activation buffer 832). The outputs (e.g., at columns 810, 812) of the kernel 806 may be coupled to an analog to digital converter (ADC) 840. The ADC 840 takes as input the signals from columns 810, 812, and generates a digital representation of the signals, taking into account that bits stored in column 812 represent a lower significance in respective weights than the bits stored in column 810.

The CIM array 802 may also include PW convolution cells 890 on columns 816, 818 for PW convolution calculations, as illustrated. The outputs (e.g., at columns 816, 818) of the PW convolution cells 890 may be coupled to an ADC 842. For example, each input of ADC 840 may receive an accumulated charge of rows 814 from each of columns 810, 812, and each input of ADC 842 may receive an accumulated charge from each of columns 816, 818, based on which each of ADCs 840, 842 generates a digital output signal. For example, the ADC 842 takes as input the signals from columns 816, 818, and generates a digital representation of the signals, taking into account that bits stored in column 818 represent a lower significance in respective weights than the bits stored in column 816. While ADCs 840, 842 are depicted as receiving signals from two columns to facilitate analog to digital conversion for kernels with 2-bit weight parameters, the aspects described herein may be implemented for ADCs configured to receive signals from any number of columns (e.g., three columns to perform analog to digital conversion for kernels with 3-bit weight parameters). In some aspects, an ADC such as ADC 840 or 842 may be coupled to eight columns. Further, in some aspects, accumulation may be spread across more than one ADC.

The outputs of ADCs 840, 842 may be coupled to a nonlinear operation circuit 850 (and buffer) to implement one or more nonlinear operations (e.g., in sequence), such as a rectified linear unit (ReLU) and average pooling (Ave-Pool), to name a few. Nonlinear operations allow for the creation of complex mappings between inputs and outputs and thus allow for learning and modeling complex data, such as images, video, audio, and data sets which are nonlinear or have high dimensionality. The output of the nonlinear operation circuit 850 may be coupled to activation output buffer circuit 860. The activation output buffer circuit 860 may store the output from the nonlinear operation circuit 850 to be used as the PW convolution input for a PW convolution calculation via the PW convolution cells 890. For example, the output of the activation output buffer circuit 860 may be provided to activation buffers 830. The corresponding activation inputs stored in activation buffers 830 may be provided to the PW convolution cells 890 to perform a PW convolution calculation.

While each of the kernels 806, 808 include two columns, allowing a 2-bit weight to be stored in each row of the kernel, the kernels 806, 808 may be implemented using any number of suitable columns, such as one column for a 1-bit, binary weight or two or more columns for multibit weights. For example, each of the kernels 806, 808 may be implemented using three columns to facilitate a three-bit weight parameter to be stored in each row of the kernel, or using a single column to facilitate a one-bit weight to be stored in each row of the kernel. Moreover, while each of kernels 806, 808 are implemented with nine rows for a 3×3 kernel to facilitate understanding, the kernels 806, 808 may be implemented with any number of rows to implement a suitable kernel size. Moreover, more than two kernels may be implemented using subset of cells of a CIM array. For example, the CIM array 802 may include one or more other kernels, where the kernels of the CIM array 802 are implemented on different rows and same columns.

The aspects described herein provide flexibility in configuring any CIM array on demand for DW convolution operations. For example, the number of rows used to implement each of kernels 806, 808 may be increased to increase the size of each respective kernel (e.g., implement a 5×5 kernel). Moreover, certain aspects allow for an increase of the number of kernels that may be implemented on a CIM array as compared to conventional implementations. In other words, certain aspects of the present disclosure reduce the area on a CIM array consumed for DW convolution operations by implementing the kernels for DW convolution on the same columns. In this manner, the number of kernels for DW convolution that may be implemented on a CIM array may be increased as compared to conventional implementations. For example, a total of 113 3×3 filters may be implemented on a CIM array having 1024 rows. Thus, the area consumption for implementing DW convolution operations may be reduced as compared to conventional implementing that may use DMAC hardware.

Figure 9:
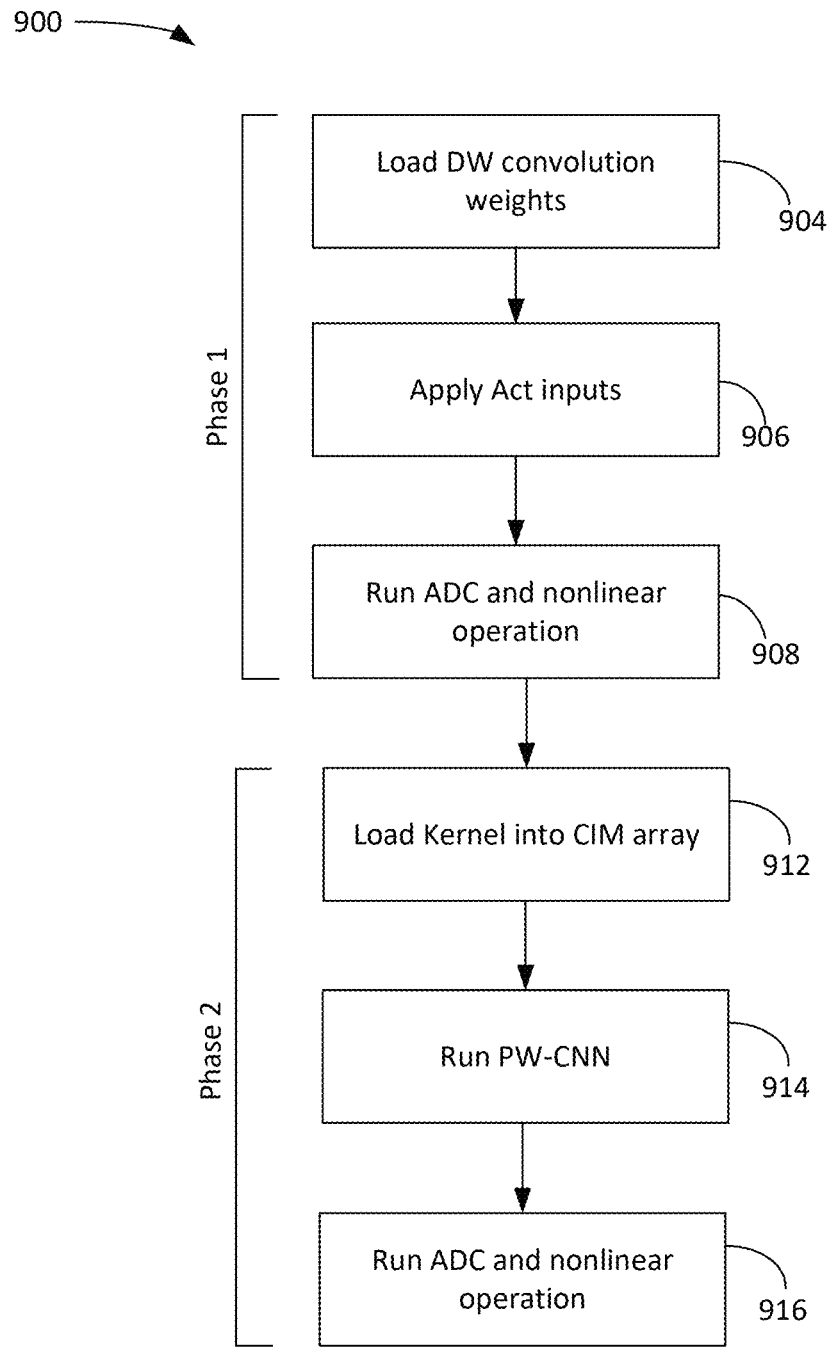
FIG. 9 illustrates example operations for signal processing via the CIM architecture of FIG. 8B, in accordance with certain aspects of the present disclosure.

FIG. 9 illustrates example operations 900 for signal processing via the CIM architecture 800 of FIG. 8B, in accordance with certain aspects of the present disclosure. One CIM array may be used for both DW convolution calculation and PW convolution calculation. The kernels for the DW convolution are operated in two phases on the same CIM array hardware.

During a first phase for DW convolution, the columns 810, 812 used by the DW convolution kernels are active. The operations 900 may begin by processing of a DW convolution layer. For example, at block 904, DW convolution weights may be loaded in the CIM cells for the kernels. That is, at block 904, DW 3×3 kernel weights may be grouped into rows and written into the CIM cells for the kernels 806, 808 of the CIM array 802 of FIG. 8. That is, a 2-bit kernel weight may be provided to columns 810, 812, and pass gate switches of memory cells (e.g., memory cells b11 and b01 shown in FIG. 8) may be closed to store the 2-bit kernel weights in the memory cells. Filter weights may be stored in each row of each of the kernels 806, 808. The remaining CIM columns may be used to write PW convolution weights in PW convolution cells 890. Both DW convolution and PW convolution weights will be updated for each of the subsequent layers. In some implementations, the CIM array may be partitioned into tiles that can be configured in tristate mode, as described in more detail herein. In some aspects, the tiles on the same column as the active kernel may be configured in a tristate mode. In tristate mode, the output of memory cell of a tile may be configured to have a relatively high impedance, effectively removing the cell's influence on the output.

At block 906, the DW convolution activation input (e.g., at activation buffer 830) may be applied for each group of rows of kernels 806, 808 sequentially to generate a DW convolution output for each kernel. Only one of the kernels 806, 808 may be active at one time. Non-active filter rows may be placed in a tristate mode of operation.

At block 908, ADC 840 may convert the convolution output of the kernels 806, 808 (e.g. at columns 810, 812) from the analog domain to the digital domain. A nonlinear operation may be performed via the nonlinear operation circuit 850 based on the output of the ADC 840 for the DW convolution. The output from the nonlinear operation circuit 850 may be applied to the PW convolution input (e.g., stored in activation output buffer circuit 860) to perform a PW convolution operation. In other words, the PW convolution input may be written to the activation buffer 830 and applied to the PW convolution cells 890 on the rows 814, 820 and columns 816, 818.

The operations 900 may continue to phase 2 by processing the PW convolution operation. For example, at block 912, the CIM array may be loaded with the kernel for PW convolution. For example, the PW convolution columns (e.g., columns 816, 818) may be enabled and the DW convolution columns (e.g., columns 810, 812) may be disabled. At block 914, the PW convolution may be performed and the output of the PW convolution may be converted to a digital signal via the ADC 842. At block 916, ADC 842 may convert the output of the PW convolution cells 890 from the analog domain to the digital domain. A nonlinear activation operation (e.g., ReLU) may be performed via the nonlinear operation circuit 850 based on the output of the ADC 842 for the PW convolution.

Techniques for Reducing Power Consumption and Increasing CIM Array Utilization

Figure 10:
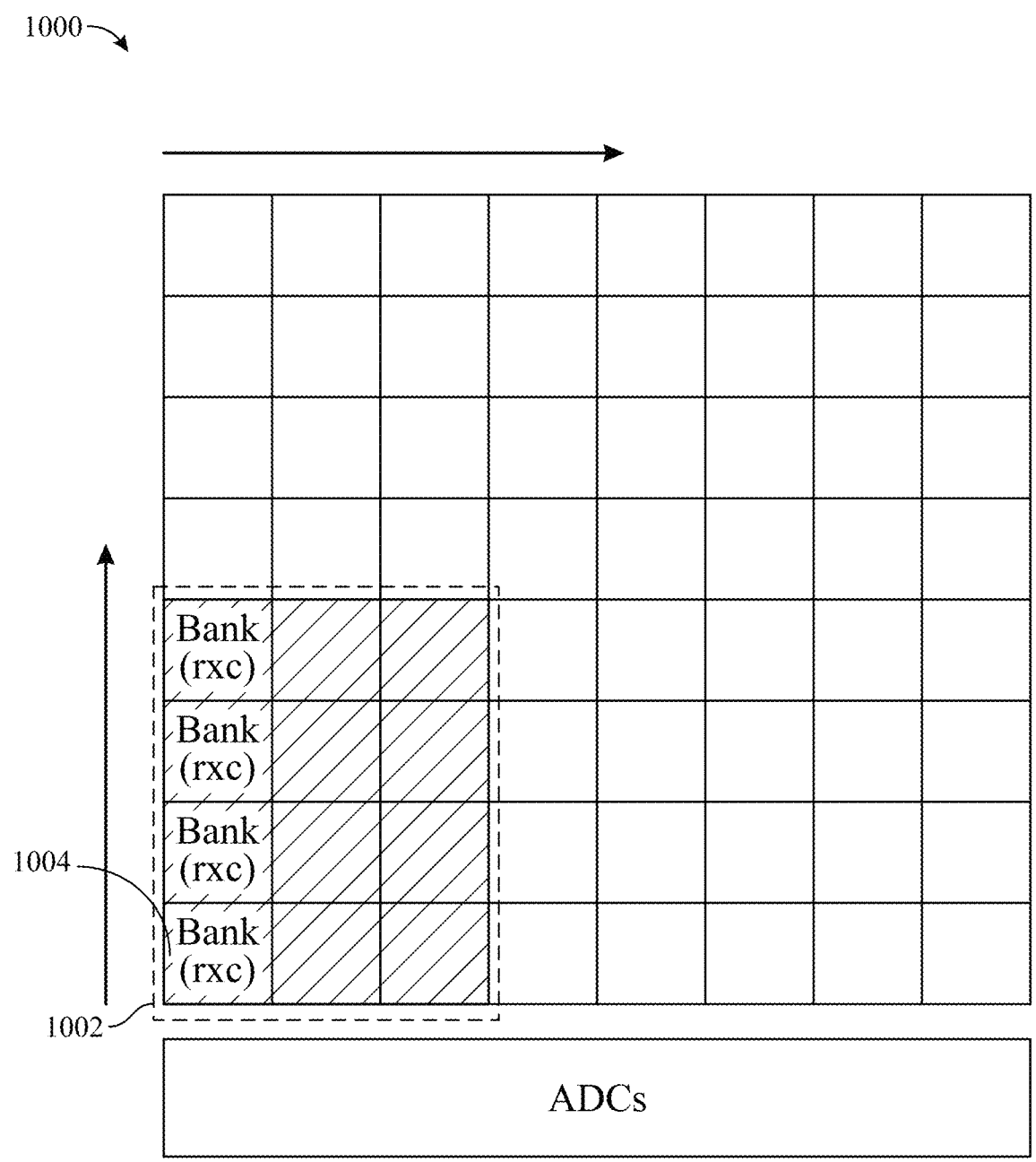
FIG. 10 illustrates a CIM array divided into sub-banks to improve processing efficiency, in accordance with certain aspects of the present disclosure.

FIG. 10 illustrates a CIM array 1000 divided into tiles (also referred to as sub-banks) to save power, in accordance with certain aspects of the present disclosure. The CIM array 1000 may have 1024 rows and 256 columns, as an example. Individual tiles of rows and columns may be enabled or disabled. For instance, a tile may include 128 rows and 23 columns. As one example, the tiles 1002 (e.g., including multiple tiles, such as tile 1004) may be active for convolution, while the remaining tiles may be disabled. In other words, the remaining tiles may be configured in tristate mode.

In some implementations, row and column filler cells may be implemented in the CIM array 1000. The filler circuits (e.g., buffers or switches) may be used to enable or disable tiles of a CIM array to save power. As an example, a column filler cell may be implemented using AND gating logic, a row filler cell may be implemented using a buffer on a write bit-line (WBL), and a transmission switch on a read bit-line (RBL). The size and type of the transmission switch may be configured based on linearity specifications.

DW convolution may use relatively small kernel dimensions (3×3, 5×5, . . . ) and the underutilization of the CIM array may affect output signal to noise ratio (SNR) due to range compression (e.g., the output of the neural network being distributed within a small range due to nonlinear activation). Certain aspects of the present disclosure are directed to techniques for improving the SNR, as described in more detail with respect to FIG. 11.

Figure 11:
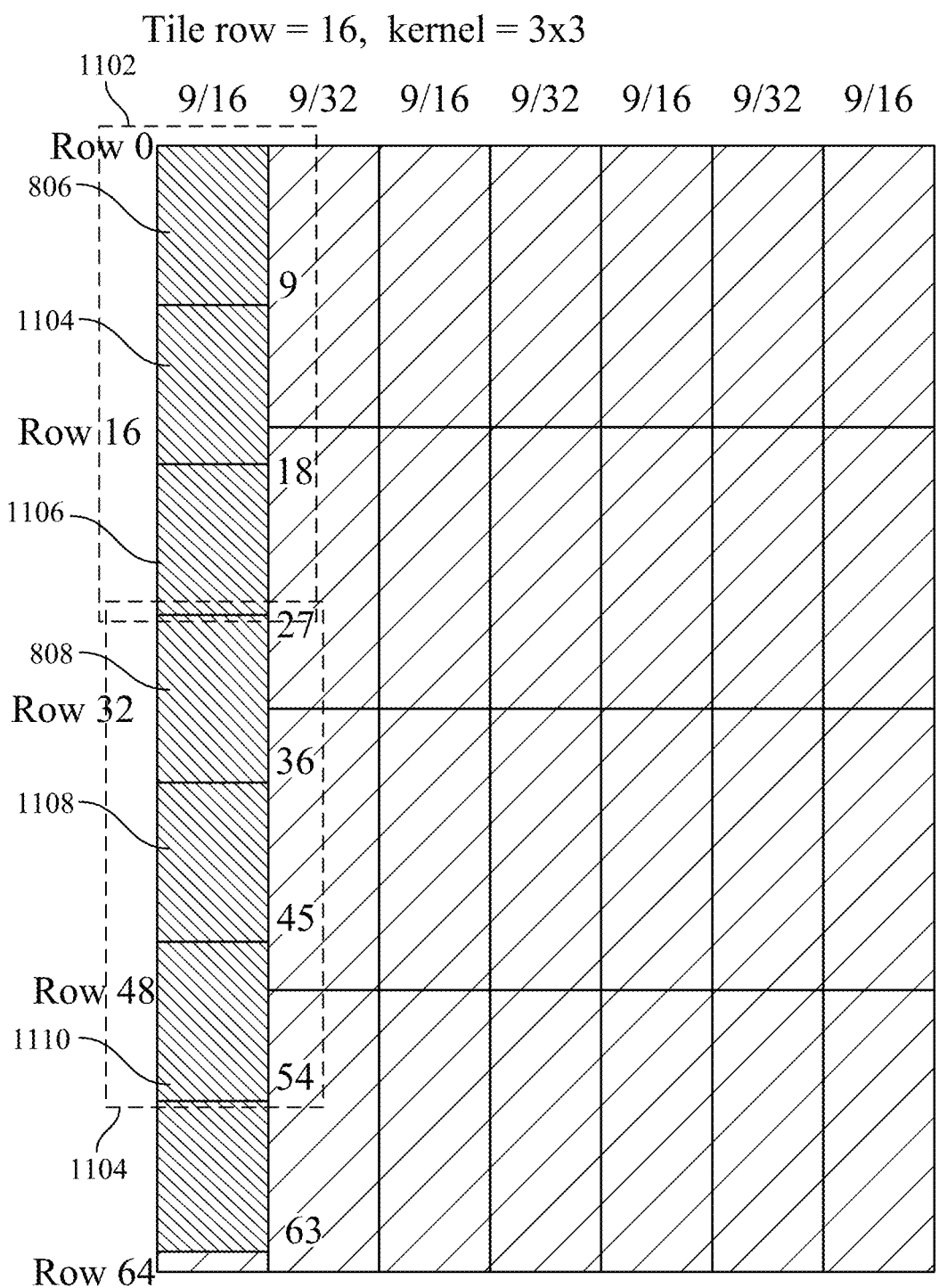
FIG. 11 illustrates a CIM array implemented with repeated kernels to improve processing accuracy, in accordance with certain aspects of the present disclosure.

FIG. 11 illustrates a CIM array implemented with repeated kernels, in accordance with certain aspects of the present disclosure.

As illustrated, each of kernels 806, 808 may be repeated to form a kernel group. For instance, the kernels 806, 1104, 1106 form a kernel group 1102, and each of kernels 806, 1104, and 1106 include the same weights. Further, multiple kernel groups may be implemented on the same columns, such kernel groups 1102 and 1104. Because the repeated kernels 806, 1104, 1106 in group 1102 have the same weights, the same activation inputs may be provided to each of the repeated kernels in the group. The same is true for group 1104.

Repeated kernels may generate the same output signals that are combined at each column (output), resulting in an increase of the dynamic range at the output for the repeated kernels. For example, using three repeated kernels may result in the dynamic range at the output of the repeated kernels that is provided to an ADC (e.g., ADC 840) to be tripled. Increasing the dynamic range at the output of the kernels facilitates analog to digital conversion with higher accuracy because it may take advantage of a wider range of the ADC. In other words, using the entire range of the ADC input allows the digital output of the ADC to more accurately identify the analog input of the ADC and improve the signal to noise ratio (SNR) of the ADC.

In some aspects, a relatively small tile size may be used for a CIM bank that runs DW convolution (e.g., 16 rows and 32 columns), allowing a greater number of CIM cells to be deactivated to save power. For example, three CIM cell groups (e.g., having multiple tiles) may be designed to run a neural network architecture inverse bottleneck. Inverse bottleneck operations generally refer to operations used to expand input features, followed by a DW convolution and reduction of DW output dimension via PW convolution.

As one example, a first CIM cell group (CIM1) may be used for a bottleneck operation, a second CIM cell group (CIM2) may be used for DW convolution operation, a third CIM cell group (CIM3) may be used for the bottleneck operation. In some aspects, CIM2 for DW convolution may have a finer tiling arrangement (e.g., 16 rows to implement 3×3 kernel, or 32 rows to implement a 5×5 kernel) to improve CIM array utilization, while CIM1 and CIM3 may have coarse grain tiling (e.g. 64 or 128 rows) to avoid the impact of filler cells for non-DW convolution operations. In this manner, the CIM array library's reusability may be doubled for DW and non-DW operations.

The average (e.g., approximate) CIM utilization with coarse grain tiling (e.g., where each tile uses 64 rows and 32 columns of a CIM array having 1024 rows), may be 13.8% for 3×3 kernels, and 31.44% for 5×5 kernels. In other words, only 13.8% of active memory cells in the CIM array may be utilized for 3×3 kernels, and 31.44% of active memory cells the CIM array may be utilized for 5×5 kernels. On the other hand, average CIM utilization with fine grain tiling (e.g., using 16 rows and 32 columns per tile, and with the CIM array having 1024 rows) may be 40.46% for 3×3 kernels, and 47.64% for 5×5 kernels. Average CIM utilization with fine grain tiling (e.g., using 32 rows and 32 columns per tile of a CIM array having 1024 rows) may be 24.18% for 3×3 kernels, and 47.64% for 5×5 kernels. Thus, fine tiling improves CIM array utilization for smaller kernel size filters (e.g., such as those used for many popular DW-CNN architectures). Improving CIM array utilization results in a higher percentage of active memory cells to be utilized, reducing power loss that would be caused by active memory cells that are not utilized.

Generally, utilization may be improved by choosing (e.g., during chip-design) the tiling size closer to the kernel size. For example, a tile size of 16 may be used for a kernel size of 9. In some aspects, the tile size may be determined as a power of 2 (log scale) greater than the kernel size to improve flexibility to handle different neural network models.

Example Operations for Performing Neural Network Processing in a CIM Array

Figure 12:
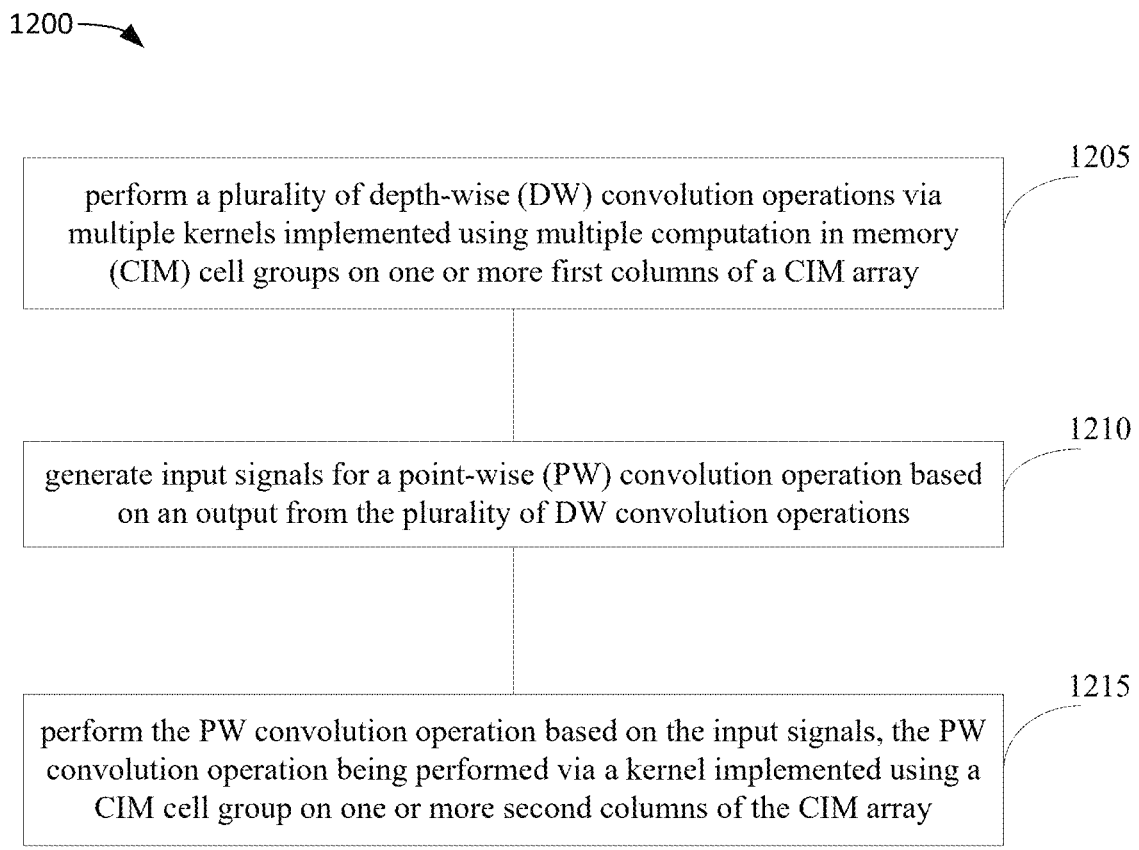
FIG. 12 is a flow diagram illustrating example operations for signal processing in a neural network, in accordance with certain aspects of the present disclosure.

FIG. 12 is a flow diagram illustrating example operations 1200 for signal processing in a neural network, in accordance with certain aspects of the present disclosure. The operations 1200 may be performed by a neural network system, which may include a controller such as a CIM controller 1332 as described with respect to FIG. 13, and a CIM system such as the CIM system 800.

The operations 1200 begin at block 1205 by the neural network system performing a plurality of depth-wise (DW) convolution operations via multiple kernels (e.g., kernels 806, 808, 809) implemented using multiple computation in memory (CIM) cell groups on one or more first columns (e.g., columns 810, 812) of a CIM array (e.g., CIM array 802). As an example, performing the plurality of DW convolution operations may include loading, via the one or more first columns, first set of CIM cells of the multiple CIM cell groups with a first plurality of weight parameters for a first kernel (e.g., kernel 806) of the multiple kernels, the first set of CIM cells comprising a first plurality of rows (e.g., rows 814) of the CIM array, and performing a first DW convolution operation of the plurality of DW convolution operations via the first kernel, where performing the first DW convolution operation comprises applying first activation inputs (e.g., via activation buggers 830) to the first plurality of rows. Performing the plurality of DW convolution operations may also include loading, via the one or more first columns, second set of CIM cells of the multiple CIM cell groups with a second plurality of weight parameters of a second kernel (e.g., kernel 808) of the multiple kernels, the second set of CIM cells comprising the one or more first columns and a second plurality of rows (e.g., rows 820) of the CIM array, the first plurality of rows being different than the second plurality of rows, and performing a second DW convolution operation of the plurality of DW convolution operations via the second kernel, where performing the second DW convolution operation comprises applying second activation inputs (e.g., via activation buffers 832) to the second plurality of rows. In some aspects, the first set of CIM cells includes a subset of cells of the CIM array and the second set of CIM cells includes another subset of cells of the CIM array.

At block 1210, the neural network system may generate (e.g., via ADC 840 and non-linear operation circuit 850) input signals for a PW convolution operation based on an output from the plurality of DW convolution operations. At block 1215, the neural network system may perform the PW convolution operation based on the input signals, the PW convolution operation being performed via a kernel implemented using a CIM cell group on one or more second columns of the CIM array. For example, performing the PW convolution operation may include loading the CIM cell group for the kernel on the one or more second columns with a third plurality of weights. In some aspects, the neural network system may generate a digital signal by converting a voltage at the one or more first columns from an analog domain to a digital domain after performing the plurality of DW convolution operations. The input signals to the CIM cell group on the one or more second columns may be generated based on the digital signal.

In some aspects, kernels may be repeated to improve utilization of the CIM array and improve ADC dynamic range, as described herein. For example, the neural network system may load, via the one or more first columns, a third set of CIM cells of the multiple CIM cell groups with the first plurality of weight parameters to perform the first DW convolution operation, the third set of CIM cells comprising the one or more first columns and a third plurality of rows of the CIM array.

Example Processing Systems for Performing Phase Selective Convolution

Figure 13:
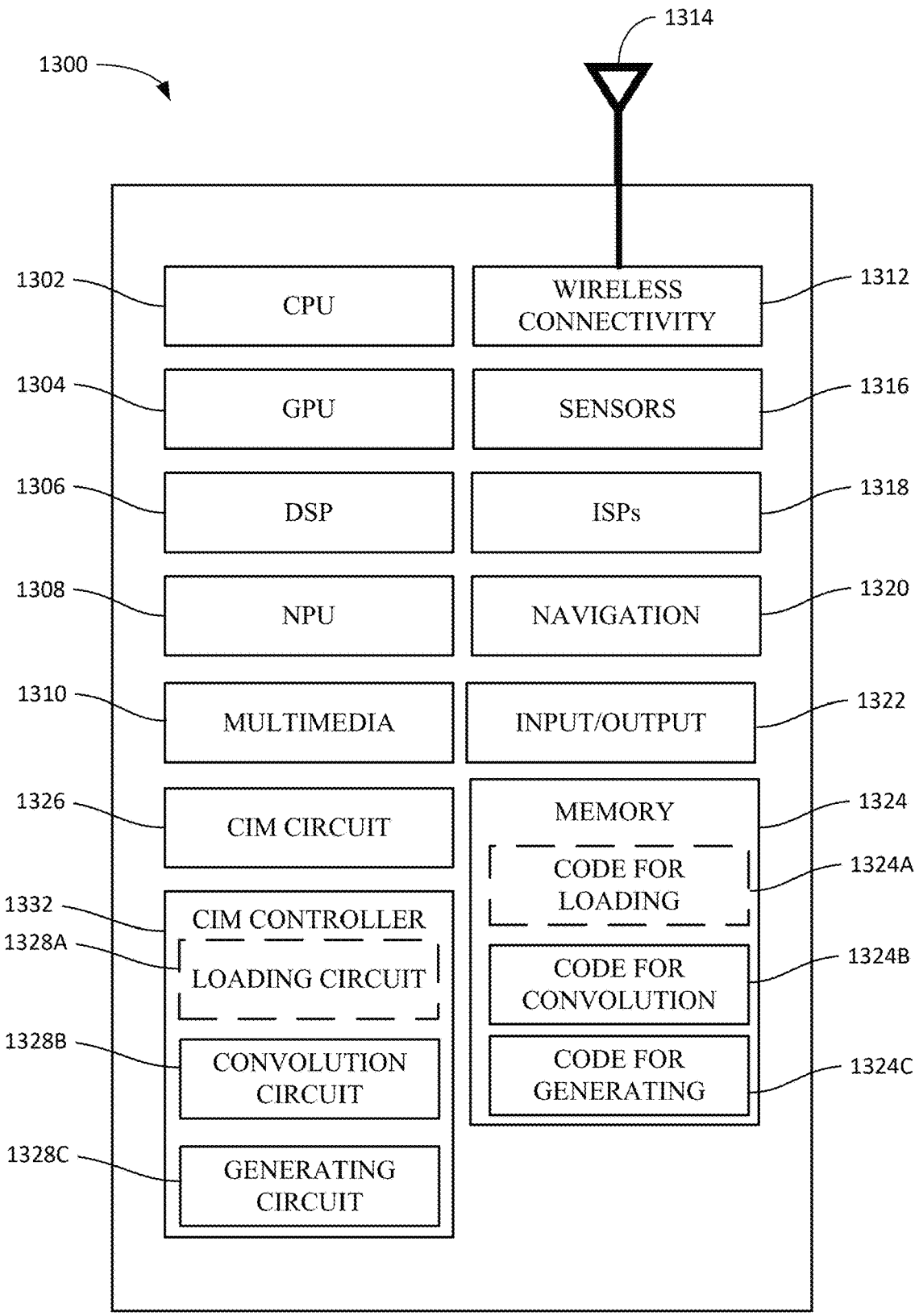
FIG. 13 illustrates an example electronic device configured to perform operations for signal processing in a neural network, in accordance with certain aspects of the present disclosure.

FIG. 13 illustrates an example electronic device 1300. Electronic device 1300 may be configured to perform the methods described herein, including operations 1200 described with respect to FIG. 12.

Electronic device 1300 includes a central processing unit (CPU) 1302, which in some aspects may be a multi-core CPU. Instructions executed at the CPU 1302 may be loaded, for example, from a program memory associated with the CPU 1302 or may be loaded from a memory 1324.

Electronic device 1300 also includes additional processing blocks tailored to specific functions, such as a graphics processing unit (GPU) 1304, a digital signal processor (DSP) 1306, a neural processing unit (NPU) 1308, a multimedia processing block 1310, a multimedia processing block 1310, and a wireless connectivity processing block 1312. In one implementation, NPU 1308 is implemented in one or more of CPU 1302, GPU 1304, and/or DSP 1306.

In some aspects, wireless connectivity processing block 1312 may include components, for example, for third generation (3G) connectivity, fourth generation (4G) connectivity (e.g., 4G LTE), fifth generation connectivity (e.g., 5G or NR), Wi-Fi connectivity, Bluetooth connectivity, and wireless data transmission standards. Wireless connectivity processing block 1312 is further connected to one or more antennas 1314 to facilitate wireless communication.

Electronic device 1300 may also include one or more sensor processors 1316 associated with any manner of sensor, one or more image signal processors (ISPs) 1318 associated with any manner of image sensor, and/or a navigation processor 1320, which may include satellite-based positioning system components (e.g., GPS or GLONASS) as well as inertial positioning system components.

Electronic device 1300 may also include one or more input and/or output devices 1322, such as screens, touch-sensitive surfaces (including touch-sensitive displays), physical buttons, speakers, microphones, and the like. In some aspects, one or more of the processors of electronic device 1300 may be based on an ARM instruction set.

Electronic device 1300 also includes memory 1324, which is representative of one or more static and/or dynamic memories, such as a dynamic random access memory, a flash-based static memory, and the like. In this example, memory 1324 includes computer-executable components, which may be executed by one or more of the aforementioned processors of electronic device 1300 or a CIM controller 1332. For example, the electronic device 1300 may include a CIM circuit 1326 including one or more CIM arrays, such as the CIM array 802 and CIM array 804, as described herein. The CIM circuit 1326 may controlled via the CIM controller 1332. For instance, in some aspects, memory 1324 may include code 1324B for convolution (e.g., performing a DW or PW convolution operation by applying activation inputs). The memory 1324 may also include code 1324C for generating input signals. The memory 1324 may also optionally include code 1324A for loading (e.g., loading CIM cells with weight parameters). As illustrated, the CIM controller 1332 may include a circuit 1328B for convolution (e.g., performing a DW or PW convolution operation by applying activation inputs). The CIM controller 1332 may also include a circuit 1328C for generating input signals. The CIM controller 1332 may also optionally include a circuit 1328A for loading (e.g., loading CIM cells with weight parameters). The depicted components, and others not depicted, may be configured to perform various aspects of the methods described herein.

In some aspects, such as where electronic device 1300 is a server device, various aspects may be omitted from the aspect depicted in FIG. 13, such as one or more of multimedia processing block 1310, wireless connectivity component 1312, antenna 1314, sensor processors 1316, ISPs 1318, or navigation 1320.

Example Clauses

Aspect 1. An apparatus for signal processing in a neural network, comprising: first computation in memory (CIM) cells configured as a first kernel for a depthwise (DW) neural network computation, the first set of CIM cells comprising one or more first columns and a first plurality of rows of a CIM array; a second set of CIM cells configured as a second kernel for the neural network computation, the second set of CIM cells comprising the one or more first columns and a second plurality of rows of the CIM array, wherein the first plurality of rows are different than the second plurality of rows; and a third set of CIM cells of the CIM array configured as a third kernel for a pointwise (PW) neural network computation.

Aspect 2. The apparatus of aspect 1, wherein the first set of CIM cells includes a subset of cells of the CIM array and the second set of CIM cells includes another subset of cells of the CIM array.

Aspect 3. The apparatus of aspect 2, wherein the third set of CIM cells being a third subset of cells of the CIM array.

Aspect 4. The apparatus of any one of aspects 1-3, wherein the third set of CIM cells comprise one or more second columns of the CIM array and the first plurality of rows, the one or more second columns being different than the one or more first columns.

Aspect 5. The apparatus of any one of aspects 1-4, further comprising an analog-to-digital converter (ADC) coupled to the one or more first columns.

Aspect 6. The apparatus of aspect 5, further comprising a non-linear circuit coupled to outputs of the ADC.

Aspect 7. The apparatus of any one of aspects 1-6, further comprising third set of CIM cells configured as a third kernel for the neural network computation, the third set of CIM cells comprising the one or more first columns and a third plurality of rows of the CIM array.

Aspect 8. The apparatus of aspect 7, wherein the same weight parameters are configured to be stored in the first set of CIM cells and the third set of CIM cells when performing the neural network computation.

Aspect 9. The apparatus of any one of aspects 1-8, wherein: one or more of the first set of CIM cells on each row of the first plurality of rows is configured to store a first weight parameter; and one or more of the second set of CIM cells on each row of the second plurality of rows is configured to store a second weight parameter.

Aspect 10. The apparatus of aspect 9, wherein a quantity of the one or more first columns is associated with a quantity of one or more bits of the first weight parameter.

Aspect 11. A method for signal processing in a neural network, comprising: performing a plurality of depth-wise (DW) convolution operations via multiple kernels implemented using multiple computation in memory (CIM) cell groups on one or more first columns of a CIM array; generating input signals for a point-wise (PW) convolution operation based on an output from the plurality of DW convolution operations; and performing the PW convolution operation based on the input signals, the PW convolution operation being performed via a kernel implemented using a CIM cell group on one or more second columns of the CIM array.

Aspect 12. The method of aspect 11, wherein performing the plurality of DW convolution operations comprises: loading, via the one or more first columns, first set of CIM cells of the multiple CIM cell groups with a first plurality of weight parameters for a first kernel of the multiple kernels, the first set of CIM cells comprising a first plurality of rows of the CIM array; performing a first DW convolution operation of the plurality of DW convolution operations via the first kernel, wherein performing the first DW convolution operation comprises applying first activation inputs to the first plurality of rows; loading, via the one or more first columns, a second set of CIM cells of the multiple CIM cell groups with a second plurality of weight parameters of a second kernel of the multiple kernels, the second set of CIM cells comprising the one or more first columns and a second plurality of rows of the CIM array, wherein the first plurality of rows are different than the second plurality of rows; and performing a second DW convolution operation of the plurality of DW convolution operations via the second kernel, wherein performing the second DW convolution operation comprises applying second activation inputs to the second plurality of rows.

Aspect 13. The method of aspect 12, wherein the first set of CIM cells includes a subset of cells of the CIM array and the second set of CIM cells includes another subset of cells of the CIM array.

Aspect 14. The method of aspect 13, wherein performing the PW convolution operation comprises loading the CIM cell group for the kernel on the one or more second columns with a third plurality of weights.

Aspect 15. The method of aspect 14, further comprising: generating a digital signal by converting a voltage at the one or more first columns from an analog domain to a digital domain after performing the plurality of DW convolution operations, wherein the input signals to the CIM cell group on the one or more second columns are generated based on the digital signal.

Aspect 16. The method of any one of aspects 12-15, further comprising loading, via the one or more first columns, a third set of CIM cells of the multiple CIM cell groups with the first plurality of weight parameters to perform the first DW convolution operation, the third set of CIM cells comprising the one or more first columns and a third plurality of rows of the CIM array.

Aspect 17. A non-transitory computer-readable medium comprising instructions that, when executed by one or more processors of a processing system, cause the processing system to perform a method of signal processing in neural network, the method comprising: performing a plurality of depth-wise (DW) convolution operations via multiple kernels implemented using multiple computation in memory (CIM) cell groups on one or more first columns of a CIM array; and generating input signals for a point-wise (PW) convolution operation based on an output from the plurality of DW convolution operations; and performing the PW convolution operation based on the input signals, the PW convolution operation being performed via a CIM cell group on one or more second columns of the CIM array.

Aspect 18. The non-transitory computer-readable medium of aspect 17, wherein performing the plurality of DW convolution operations comprises: loading, via the one or more first columns, first set of CIM cells of the multiple CIM cell groups with a first plurality of weight parameters for a first kernel of the multiple kernels, the first set of CIM cells comprising a first plurality of rows of the CIM array; performing a first DW convolution operation of the plurality of DW convolution operations via the first kernel, wherein performing the first DW convolution operation comprises applying first activation inputs to the first plurality of rows; loading, via the one or more first columns, a second set of CIM cells of the multiple CIM cell groups with a second plurality of weight parameters of a second kernel of the multiple kernels, the second set of CIM cells comprising the one or more first columns and a second plurality of rows of the CIM array, wherein the first plurality of rows are different than the second plurality of rows; and performing a second DW convolution operation of the plurality of DW convolution operations via the second kernel, wherein performing the second DW convolution operation comprises applying second activation inputs to the second plurality of rows.

Aspect 19. The non-transitory computer-readable medium of aspect 18, wherein the first set of CIM cells includes a subset of cells of the CIM array and the second set of CIM cells includes another subset of cells of the CIM array.

Aspect 20. The non-transitory computer-readable medium of aspect 19, wherein performing the PW convolution operation comprises loading the CIM cell group for a third kernel on the one or more second columns with a third plurality of weights.

Aspect 21. The non-transitory computer-readable medium of aspect 20, the method further comprising: generating a digital signal by converting a voltage at the one or more first columns from an analog domain to a digital domain after performing the plurality of DW convolution operations, wherein the input signals to the CIM cell group on the one or more second columns are generated based on the digital signal.

Aspect 22. The non-transitory computer-readable medium of any one of aspects 18-21, the method further comprising loading, via the one or more first columns, third set of CIM cells of the multiple CIM cell groups with the first plurality of weight parameters to perform the first DW convolution operation, the third set of CIM cells comprising the one or more first columns and a third plurality of rows of the CIM array.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. An apparatus for signal processing in a neural network, comprising:
    a first set of computation in memory (CIM) cells configured as a first kernel for a depthwise (DW) neural network computation, the first set of CIM cells comprising one or more first columns and a first plurality of rows of a CIM array;
    a second set of CIM cells configured as a second kernel for the DW neural network computation, the second set of CIM cells comprising the one or more first columns and a second plurality of rows of the CIM array, wherein the first plurality of rows are different than the second plurality of rows; and
    a third set of CIM cells of the CIM array configured as a third kernel for a pointwise (PW) neural network computation,
    wherein the third set of CIM cells comprise one or more second columns of the CIM array and the first plurality of rows, the one or more second columns being different than the one or more first columns.

2. The apparatus of claim 1, wherein the first set of CIM cells includes a subset of cells of the CIM array and the second set of CIM cells includes another subset of cells of the CIM array.

3. The apparatus of claim 2, wherein the third set of CIM cells being a third subset of cells of the CIM array.

4. The apparatus of claim 1, further comprising an analog-to-digital converter (ADC) coupled to the one or more first columns.

5. The apparatus of claim 4, further comprising a non-linear circuit coupled to outputs of the ADC.

6. The apparatus of claim 1, further comprising a fourth set of CIM cells configured as a fourth kernel for the DW neural network computation, the fourth set of CIM cells comprising the one or more first columns and a third plurality of rows of the CIM array.

7. The apparatus of claim 6, wherein same weight parameters are configured to be stored in the first set of CIM cells and the fourth set of CIM cells when performing the DW neural network computation.

8. The apparatus of claim 1, wherein:
    one or more CIM cells of the first set of CIM cells on each row of the first plurality of rows is configured to store a first weight parameter; and
    one or more CIM cells of the second set of CIM cells on each row of the second plurality of rows is configured to store a second weight parameter.

9. The apparatus of claim 8, wherein a quantity of the one or more first columns is associated with a quantity of one or more bits of the first weight parameter.

10. A method for signal processing in a neural network, comprising:
    performing a plurality of depth-wise (DW) convolution operations via multiple kernels implemented using multiple computation in memory (CIM) cell groups on one or more first columns of a CIM array;
    generating input signals for a point-wise (PW) convolution operation based on an output from the plurality of DW convolution operations; and
    performing the PW convolution operation based on the input signals, the PW convolution operation being performed via a kernel implemented using a CIM cell group on one or more second columns of the CIM array,
    wherein performing the plurality of DW convolution operations comprises:
    loading, via the one or more first columns, first set of CIM cells of the multiple CIM cell groups with a first plurality of weight parameters for a first kernel of the multiple kernels, the first set of CIM cells comprising a first plurality of rows of the CIM array;
    performing a first DW convolution operation of the plurality of DW convolution operations via the first kernel, wherein performing the first DW convolution operation comprises applying first activation inputs to the first plurality of rows;

loading, via the one or more first columns, a second set of CIM cells of the multiple CIM cell groups with a second plurality of weight parameters of a second kernel of the multiple kernels, the second set of CIM cells comprising the one or more first columns and a second plurality of rows of the CIM array, wherein the first plurality of rows are different than the second plurality of rows; and performing a second DW convolution operation of the plurality of DW convolution operations via the second kernel, wherein performing the second DW convolution operation comprises applying second activation inputs to the second plurality of rows.

11. The method of claim 10, wherein the first set of CIM cells includes a subset of cells of the CIM array and the second set of CIM cells includes another subset of cells of the CIM array.

12. The method of claim 11, wherein performing the PW convolution operation comprises loading the CIM cell group for the kernel on the one or more second columns with a third plurality of weights.

13. The method of claim 12, further comprising:

generating a digital signal by converting a voltage at the one or more first columns from an analog domain to a digital domain after performing the plurality of DW convolution operations, wherein the input signals to the CIM cell group on the one or more second columns are generated based on the digital signal.

14. The method of claim 10, further comprising loading, via the one or more first columns, a third set of CIM cells of the multiple CIM cell groups with the first plurality of weight parameters to perform the first DW convolution operation, the third set of CIM cells comprising the one or more first columns and a third plurality of rows of the CIM array.

15. A non-transitory computer-readable medium comprising instructions that, when executed by one or more processors of a processing system, cause the processing system to perform a method of signal processing in neural network, the method comprising:

performing a plurality of depth-wise (DW) convolution operations via multiple kernels implemented using multiple computation in memory (CIM) cell groups on one or more first columns of a CIM array; and generating input signals for a point-wise (PW) convolution operation based on an output from the plurality of DW convolution operations; and performing the PW convolution operation based on the input signals, the PW convolution operation being performed via a CIM cell group on one or more second columns of the CIM array, wherein performing the plurality of DW convolution operations comprises:

loading, via the one or more first columns, first set of CIM cells of the multiple CIM cell groups with a first plurality of weight parameters for a first kernel of the multiple kernels, the first set of CIM cells comprising a first plurality of rows of the CIM array;

performing a first DW convolution operation of the plurality of DW convolution operations via the first kernel, wherein performing the first DW convolution operation comprises applying first activation inputs to the first plurality of rows;

loading, via the one or more first columns, a second set of CIM cells of the multiple CIM cell groups with a second plurality of weight parameters of a second kernel of the multiple kernels, the second set of CIM cells comprising the one or more first columns and a second plurality of rows of the CIM array, wherein the first plurality of rows are different than the second plurality of rows; and performing a second DW convolution operation of the plurality of DW convolution operations via the second kernel, wherein performing the second DW convolution operation comprises applying second activation inputs to the second plurality of rows.

16. The non-transitory computer-readable medium of claim 15, wherein the first set of CIM cells includes a subset of cells of the CIM array and the second set of CIM cells includes another subset of cells of the CIM array.

17. The non-transitory computer-readable medium of claim 16, wherein performing the PW convolution operation comprises loading the CIM cell group for a third kernel on the one or more second columns with a third plurality of weights.

18. The non-transitory computer-readable medium of claim 17, the method further comprising:

generating a digital signal by converting a voltage at the one or more first columns from an analog domain to a digital domain after performing the plurality of DW convolution operations, wherein the input signals to the CIM cell group on the one or more second columns are generated based on the digital signal.

19. The non-transitory computer-readable medium of claim 15, the method further comprising loading, via the one or more first columns, a third set of CIM cells of the multiple CIM cell groups with the first plurality of weight parameters to perform the first DW convolution operation, the third set of CIM cells comprising the one or more first columns and a third plurality of rows of the CIM array.

\* \* \* \* \*